United States Patent [19]
Okumura et al.

[11] Patent Number: 6,163,046
[45] Date of Patent: *Dec. 19, 2000

[54] SEMICONDUCTOR DEVICE AND METHOD OF FABRICATING SEMICONDUCTOR DEVICE

[75] Inventors: Yoshinori Okumura; Masayoshi Shirahata, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/795,408

[22] Filed: Feb. 5, 1997

[30] Foreign Application Priority Data

Aug. 27, 1996 [JP] Japan ............................. 8-225214

[51] Int. Cl.$^7$ ................................. H01L 27/108
[52] U.S. Cl. .......................... 257/306; 257/296
[58] Field of Search ...................... 257/755, 296, 257/306, 758

[56] References Cited

U.S. PATENT DOCUMENTS

| | | | |
|---|---|---|---|
| 4,329,706 | 5/1982 | Crowder et al. ................... | 257/755 |
| 4,987,099 | 1/1991 | Flanner ........................... | 438/620 |
| 5,006,484 | 4/1991 | Harada ............................ | 437/192 |
| 5,143,820 | 9/1992 | Kotecha et al. .................. | 430/314 |
| 5,269,880 | 12/1993 | Jolly et al. ..................... | 156/643 |
| 5,279,983 | 1/1994 | Ahn . | |
| 5,320,932 | 6/1994 | Haraguchi et al. ............... | 430/312 |
| 5,389,558 | 2/1995 | Suwanai et al. . | |
| 5,563,097 | 10/1996 | Lee ................................ | 437/187 |
| 5,689,126 | 11/1997 | Takaishi .......................... | 257/306 |
| 5,763,910 | 6/1998 | Ema ............................... | 257/301 |
| 5,811,849 | 9/1998 | Matsuura ......................... | 257/306 |

FOREIGN PATENT DOCUMENTS

| | | |
|---|---|---|
| 42 23 878 A1 | 1/1994 | Germany . |
| 43 23 961 A1 | 1/1994 | Germany . |
| 4-342166 | 11/1992 | Japan . |
| 6-69449 | 3/1994 | Japan . |
| 7-122654 | 5/1995 | Japan . |
| 7-263649 | 10/1995 | Japan . |

OTHER PUBLICATIONS

W.Wakamiya, et al., "Novel Stacked Capacitor Cell for 64Mb DRAM", VL'89, pp.69–70.

K.Iguchi, et al., "A Novel DRAM Memory Cell with Inclined–Channel Transistor and Ring–like Structure Produced through Self–Aligned Storage Contact Process", VL'91, pp.11–12.

K.Surguro, et al., "High Aspect Ratio Hole Filling with CVD Tungsten for Multi–level Interconnection", Extended Abstracts of the 18$^{th}$ (1986 International) Conference on Solid State Devices and Materials, Tokyo, (1986), pp.503–506.

*Primary Examiner*—Tom Thomas
*Assistant Examiner*—Ori Nadav
*Attorney, Agent, or Firm*—Oblon, Spivak, McClelland, Maier & Neustadt, P.C.

[57] ABSTRACT

Provided are a semiconductor device which can prevent occurrence of inconvenience caused by overetching resulting from difference between depths of contact holes simultaneously formed in a memory cell part and a peripheral circuit part and inconvenience resulting from extreme increase of an aspect ratio of the contact holes, and a method of fabricating the same. An aluminum wire (22) provided on an interlayer insulating film (20) of a peripheral circuit part is electrically connected with semiconductor diffusion regions, i.e., N$^+$-type source/drain regions (91, 92) (first semiconductor regions) and P$^+$-type source/drain regions (81, 82) (second semiconductor regions) by a bit line contact hole (12) formed through the interlayer insulating film (11) to have a buried layer (25) therein and an aluminum wire contact hole (21B) formed through other interlayer insulating films (14, 20) to have a buried layer (27) therein.

9 Claims, 40 Drawing Sheets

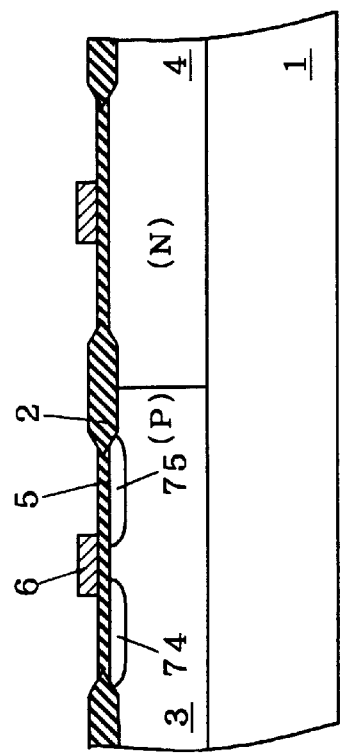
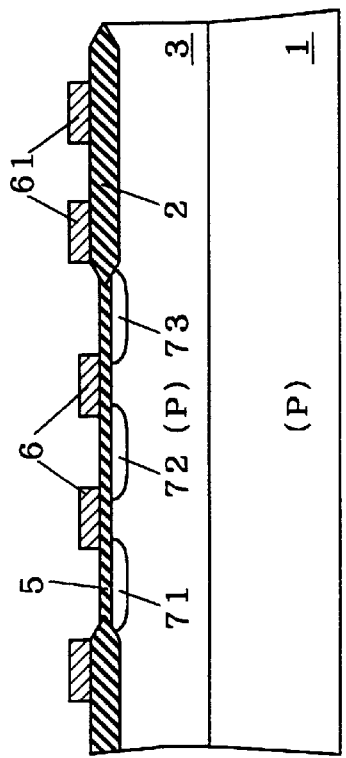

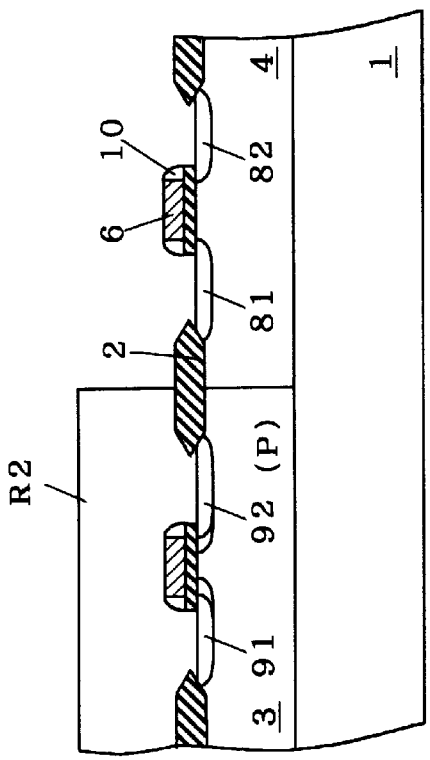
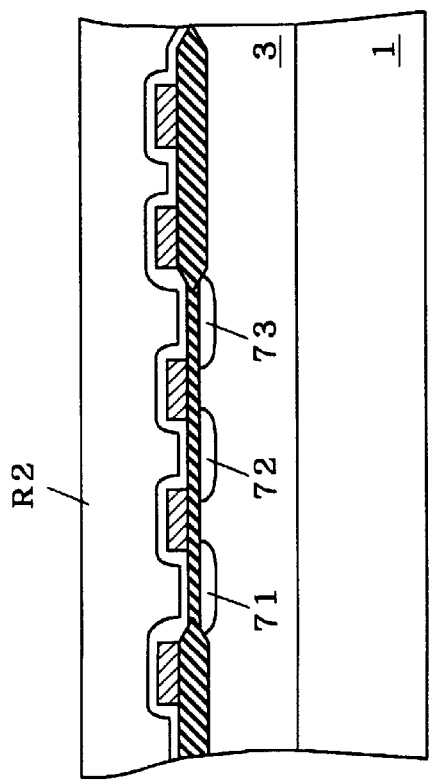

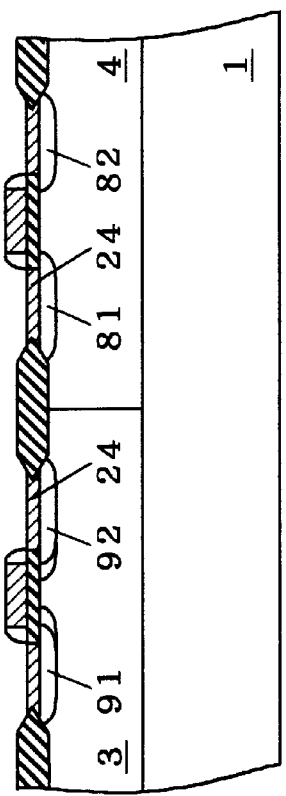
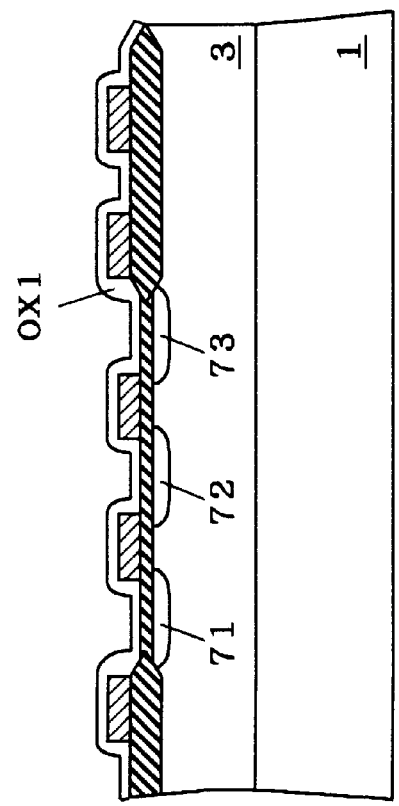

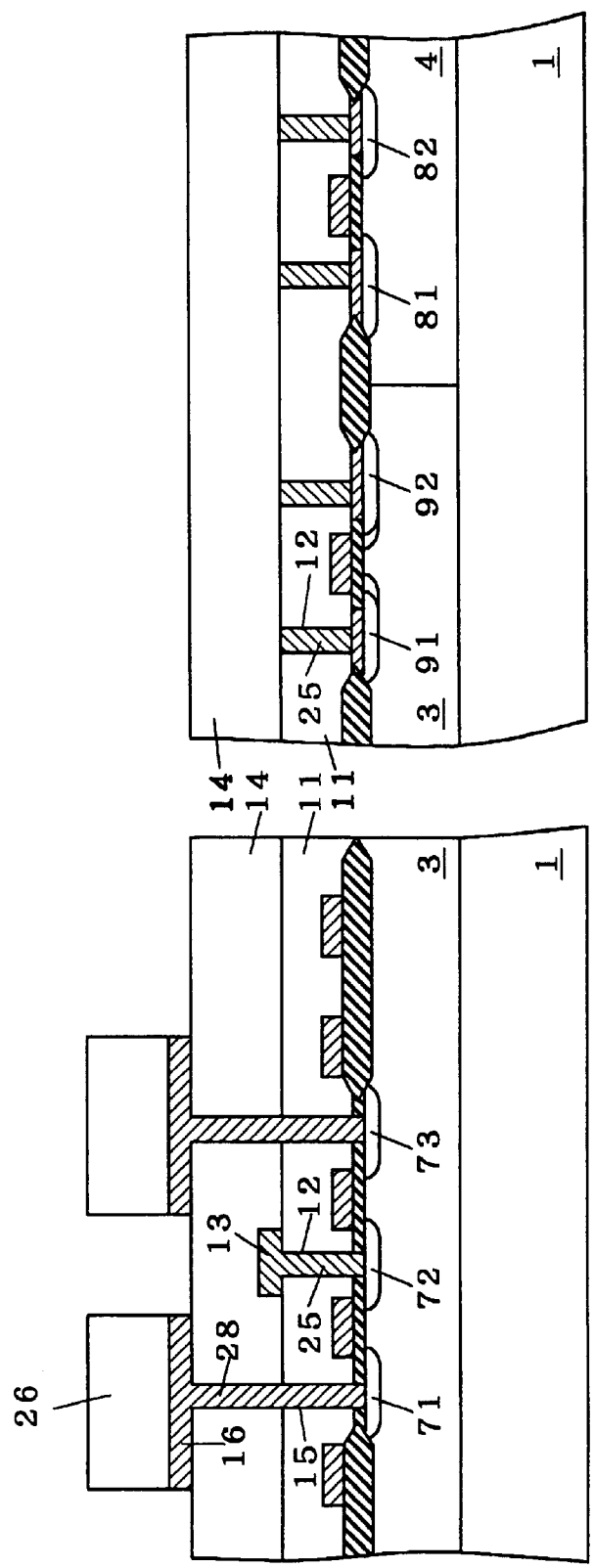

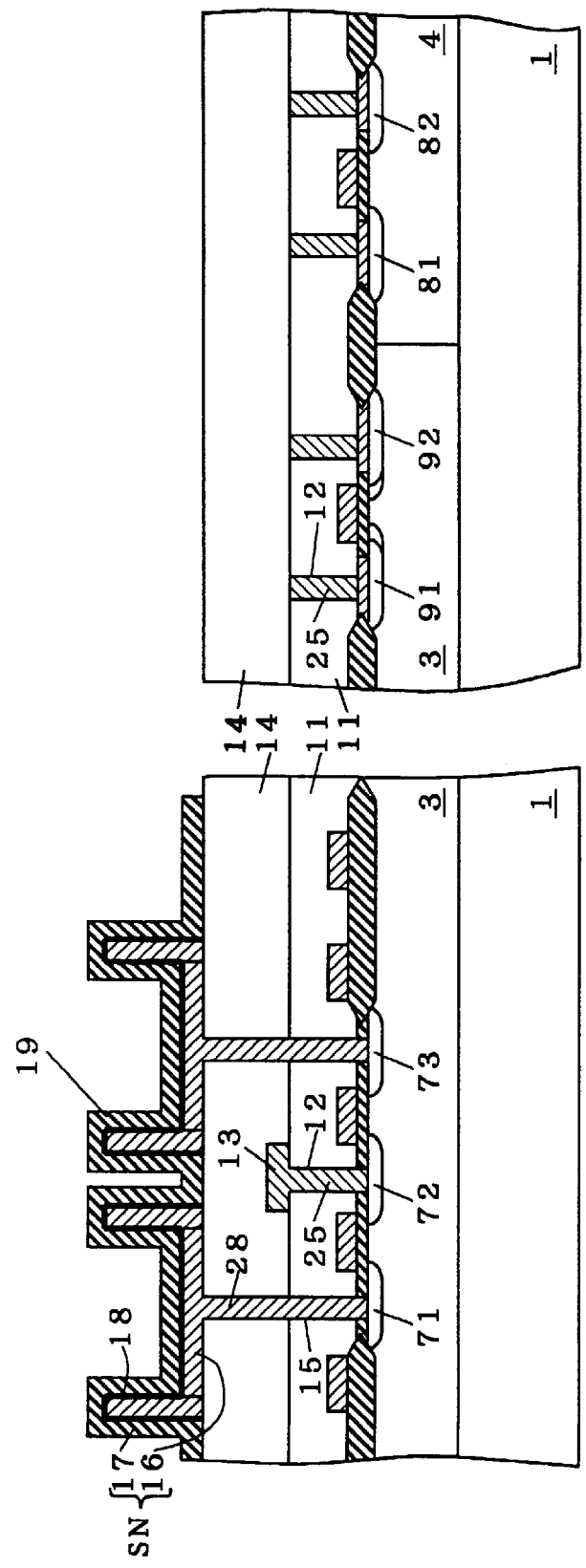

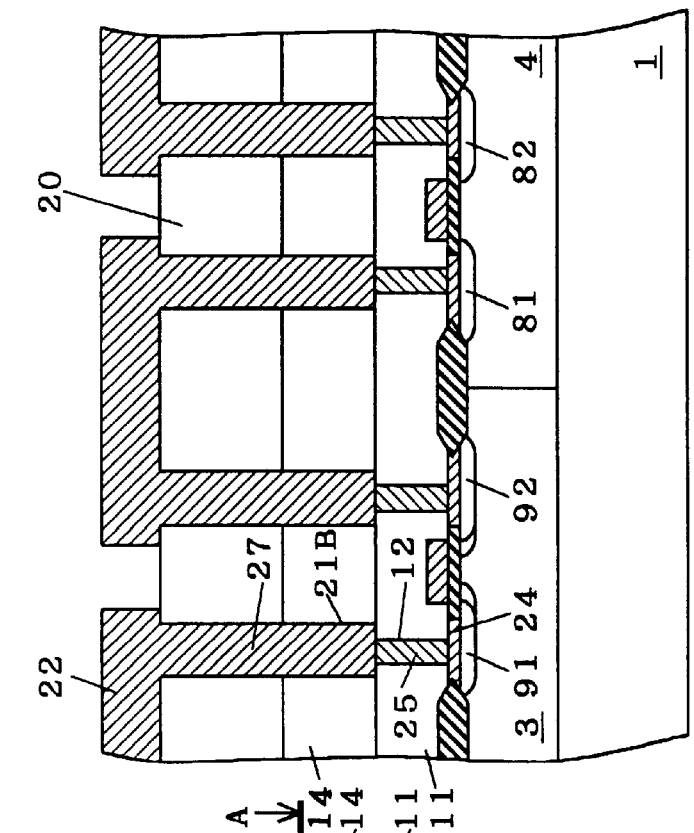
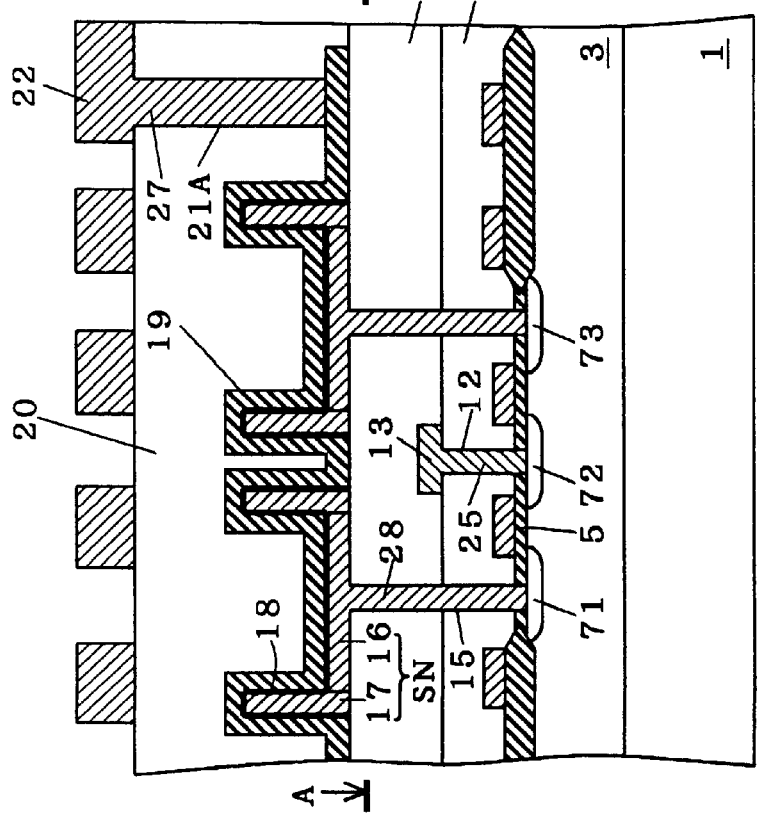

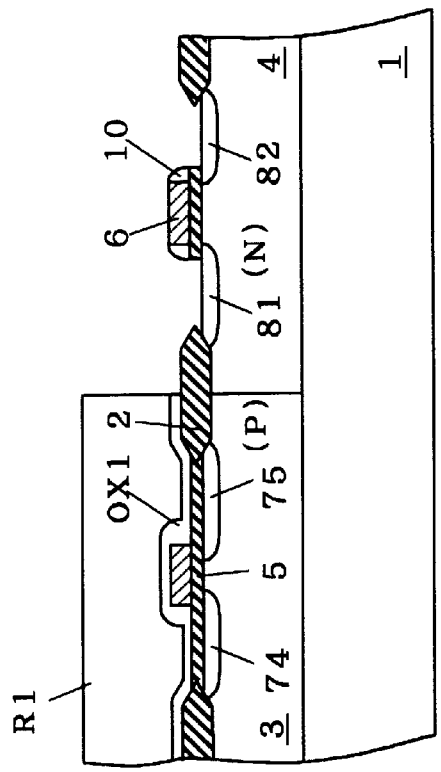
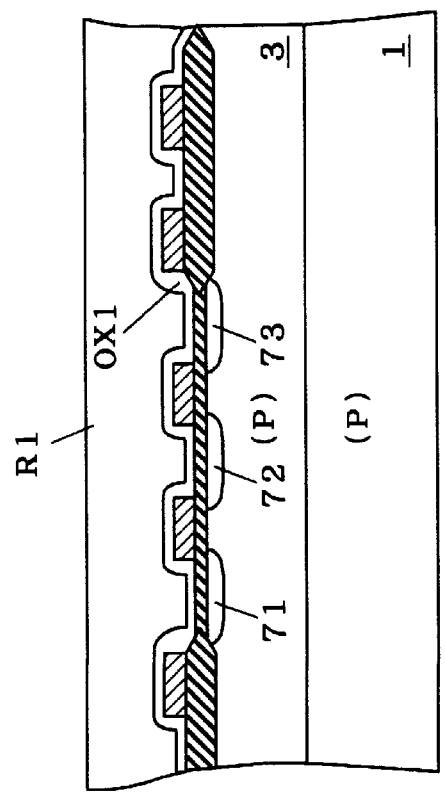
FIG. 13A
FIG. 13B

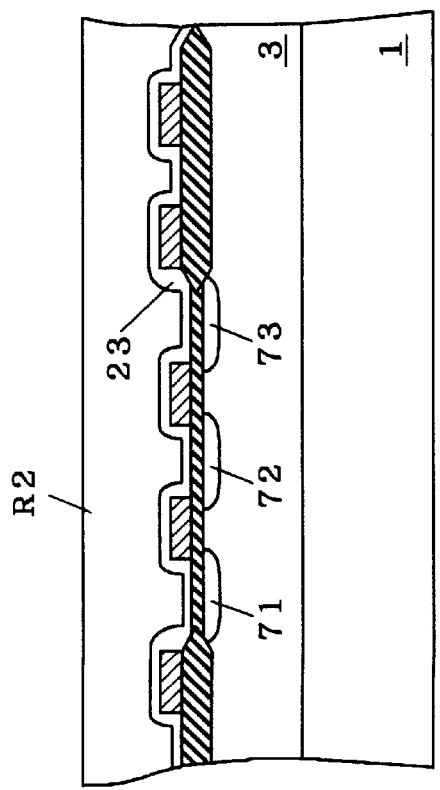

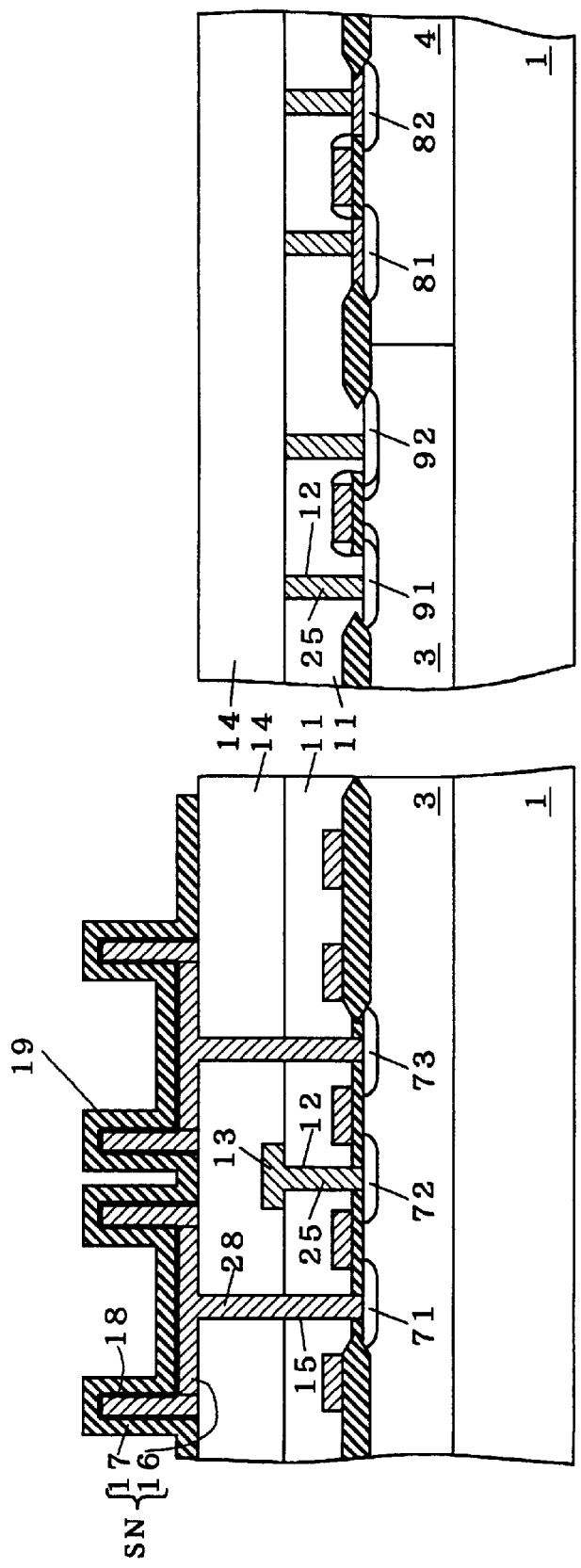

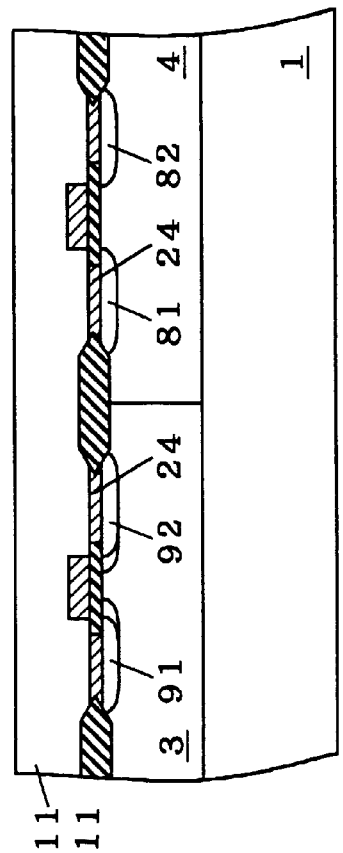
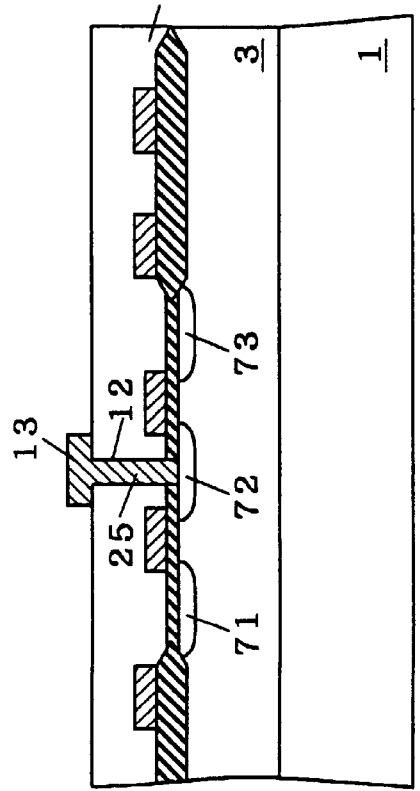

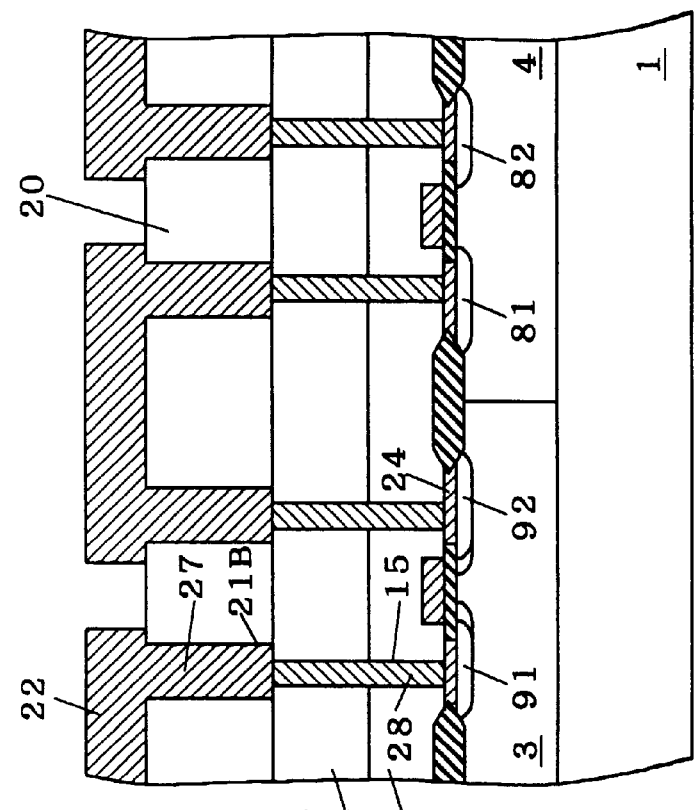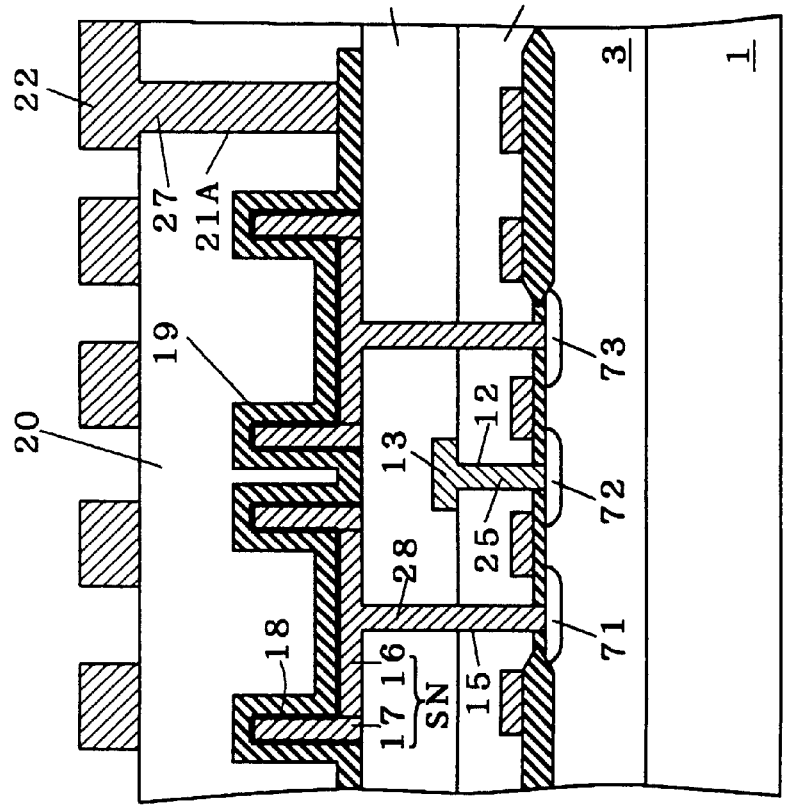

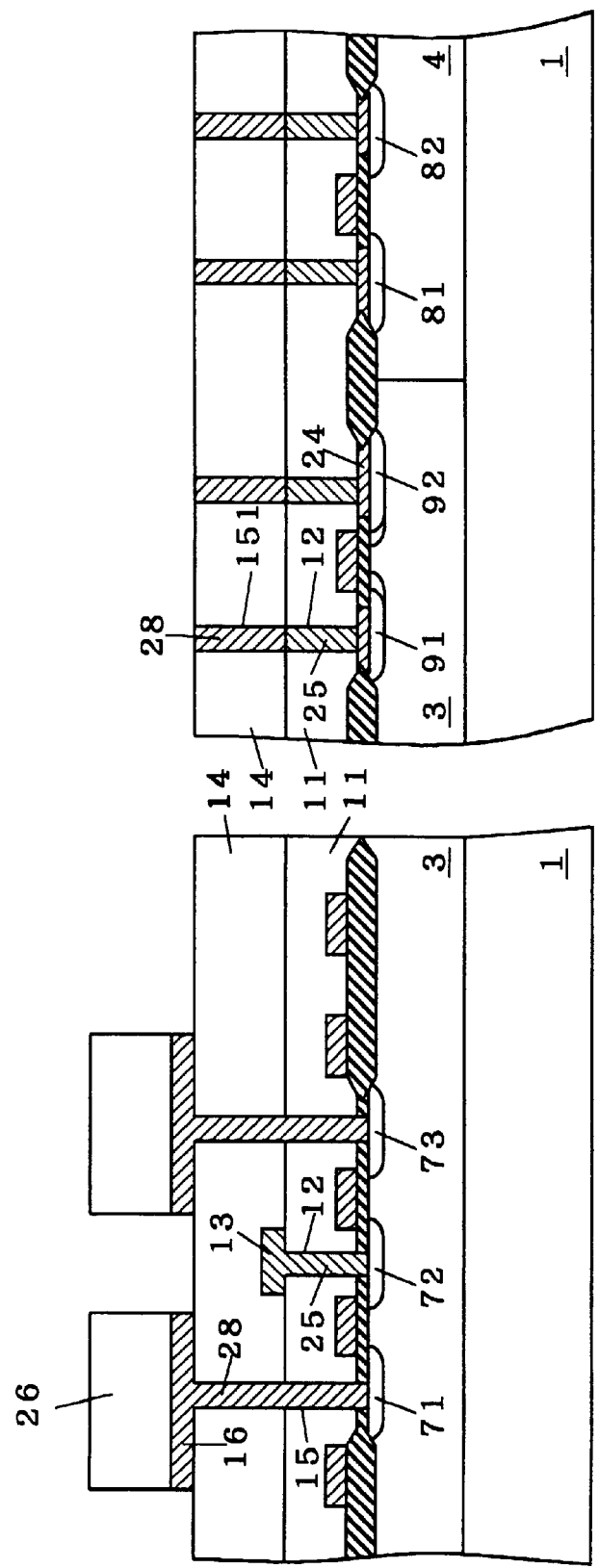

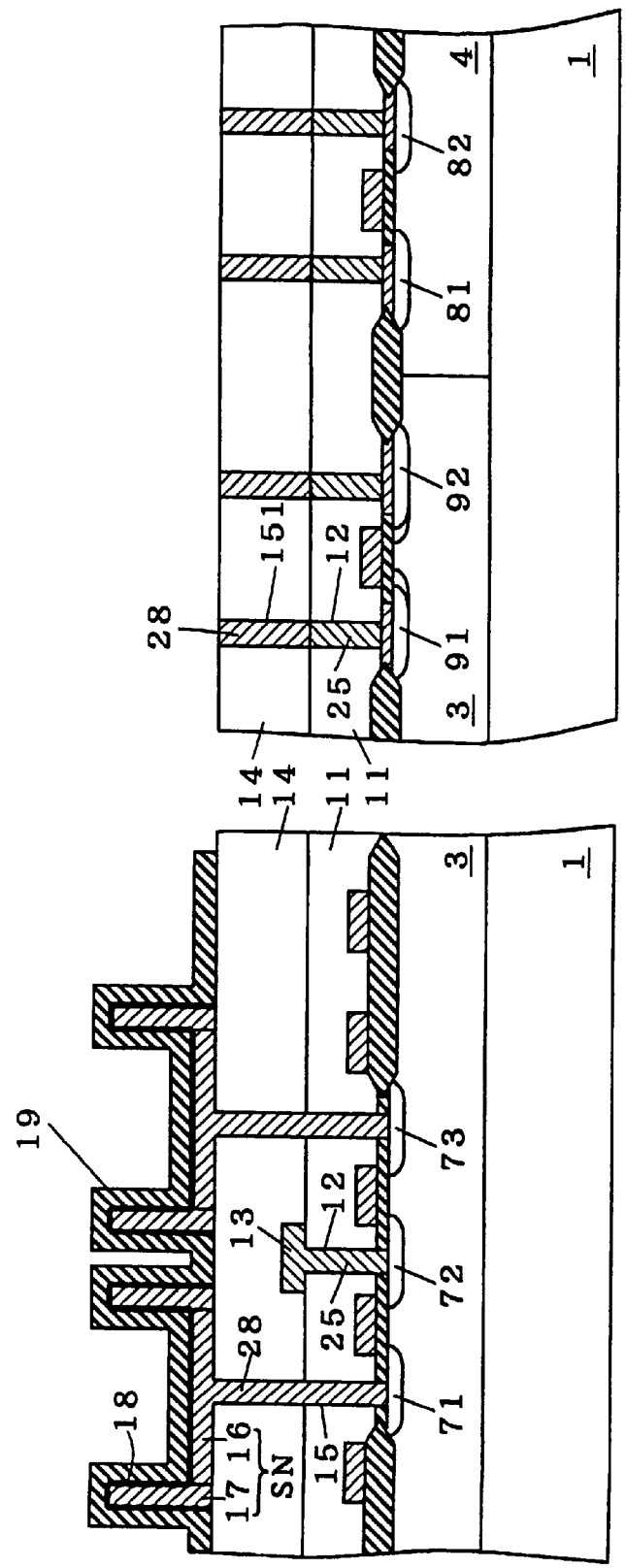

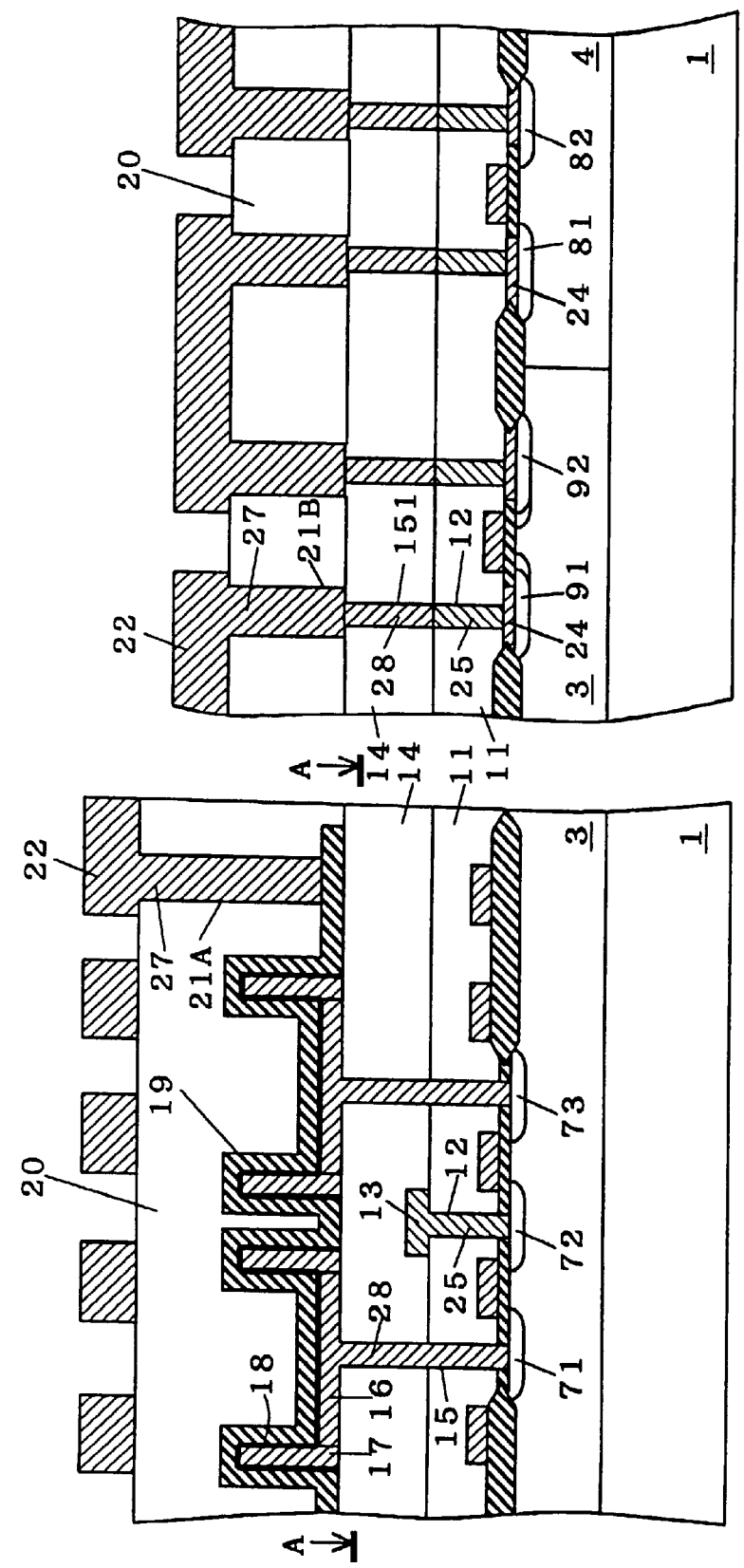

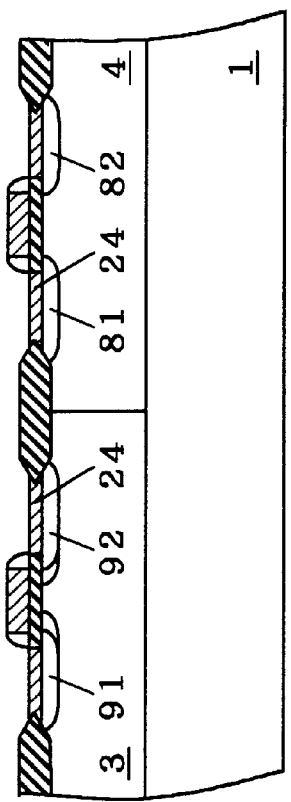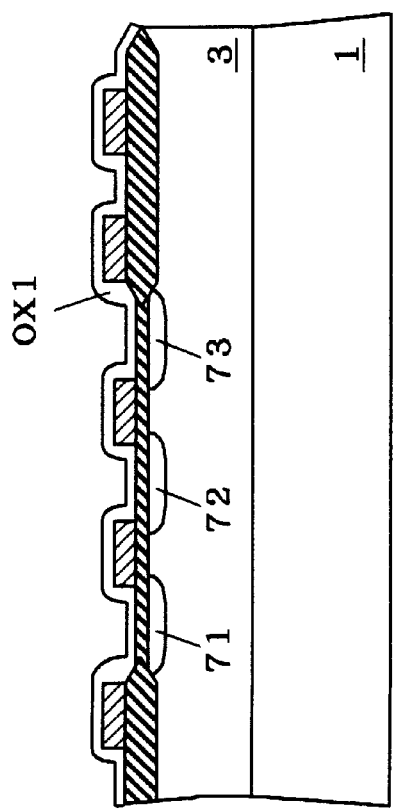
FIG. 31A
FIG. 31B

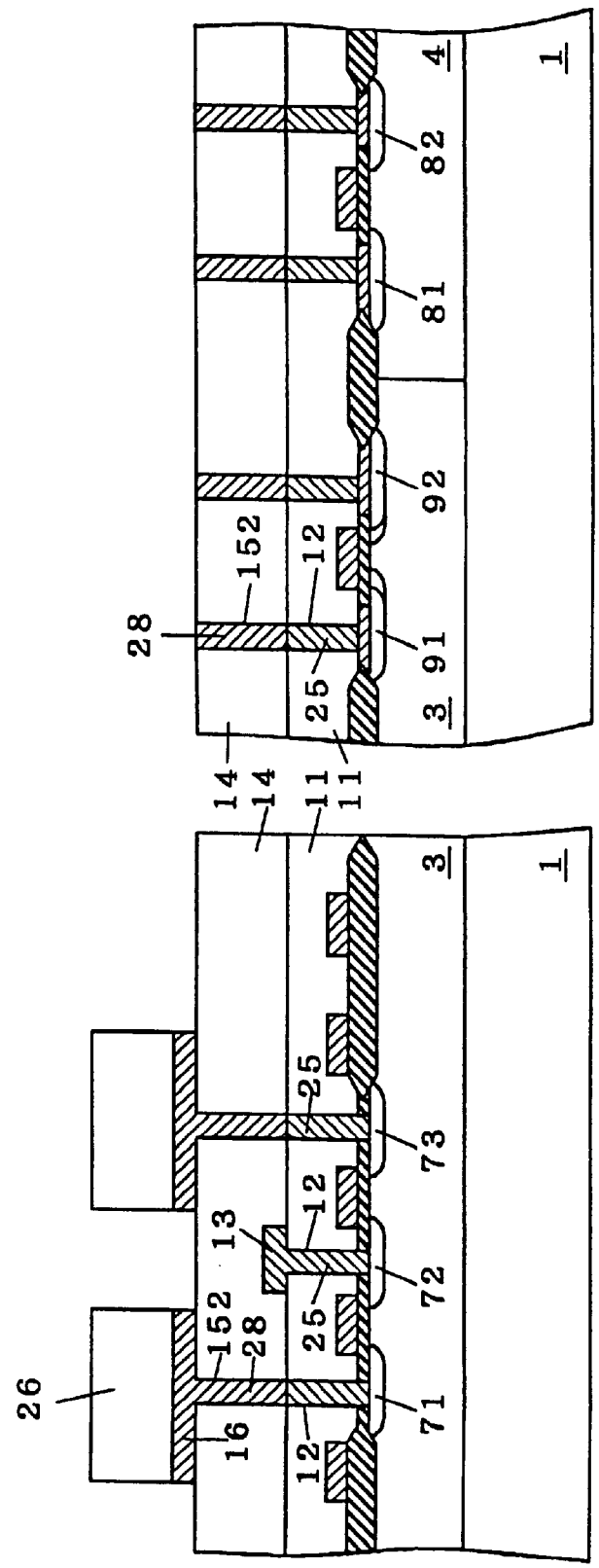

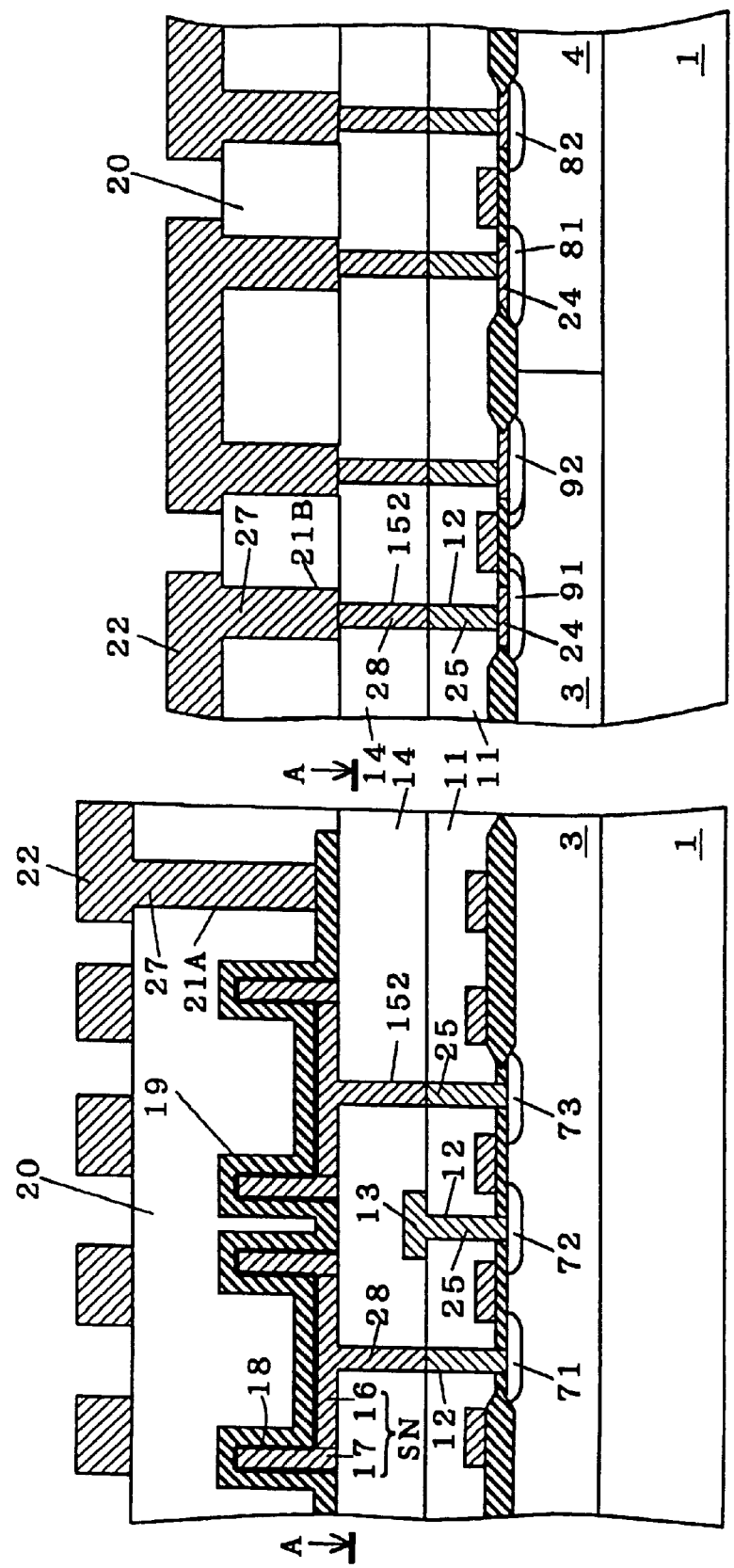

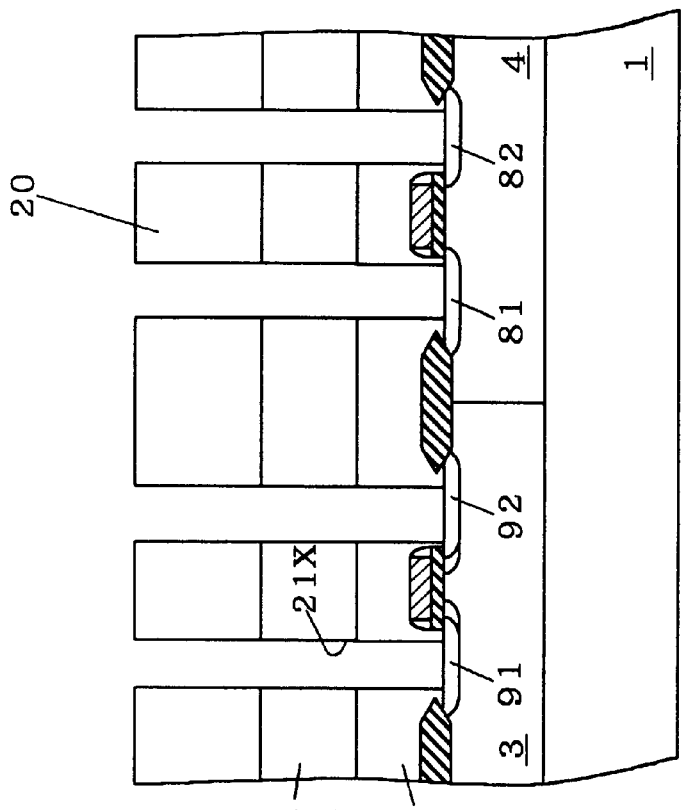
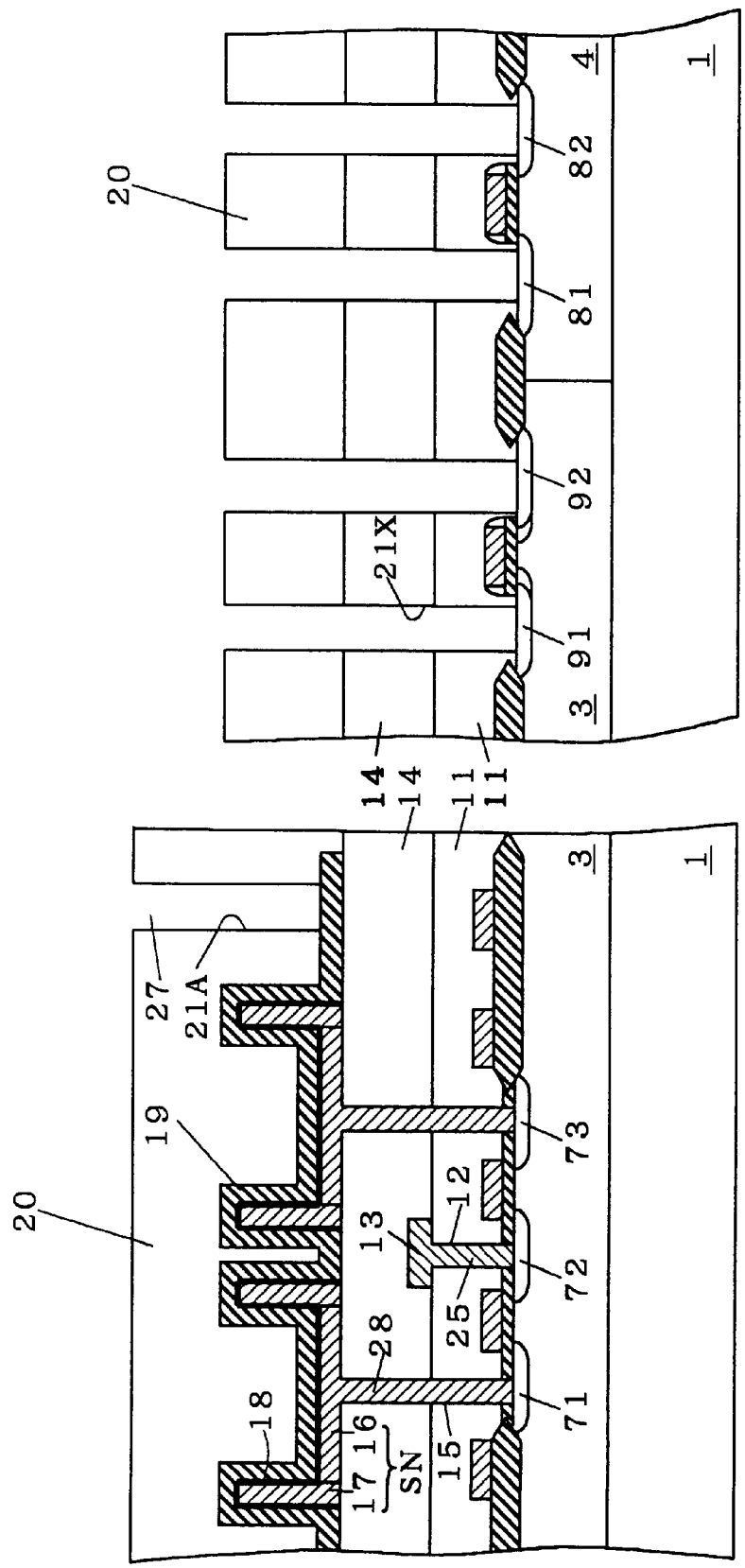
FIG. 40A (BACKGROUND ART)
FIG. 40B (BACKGROUND ART)

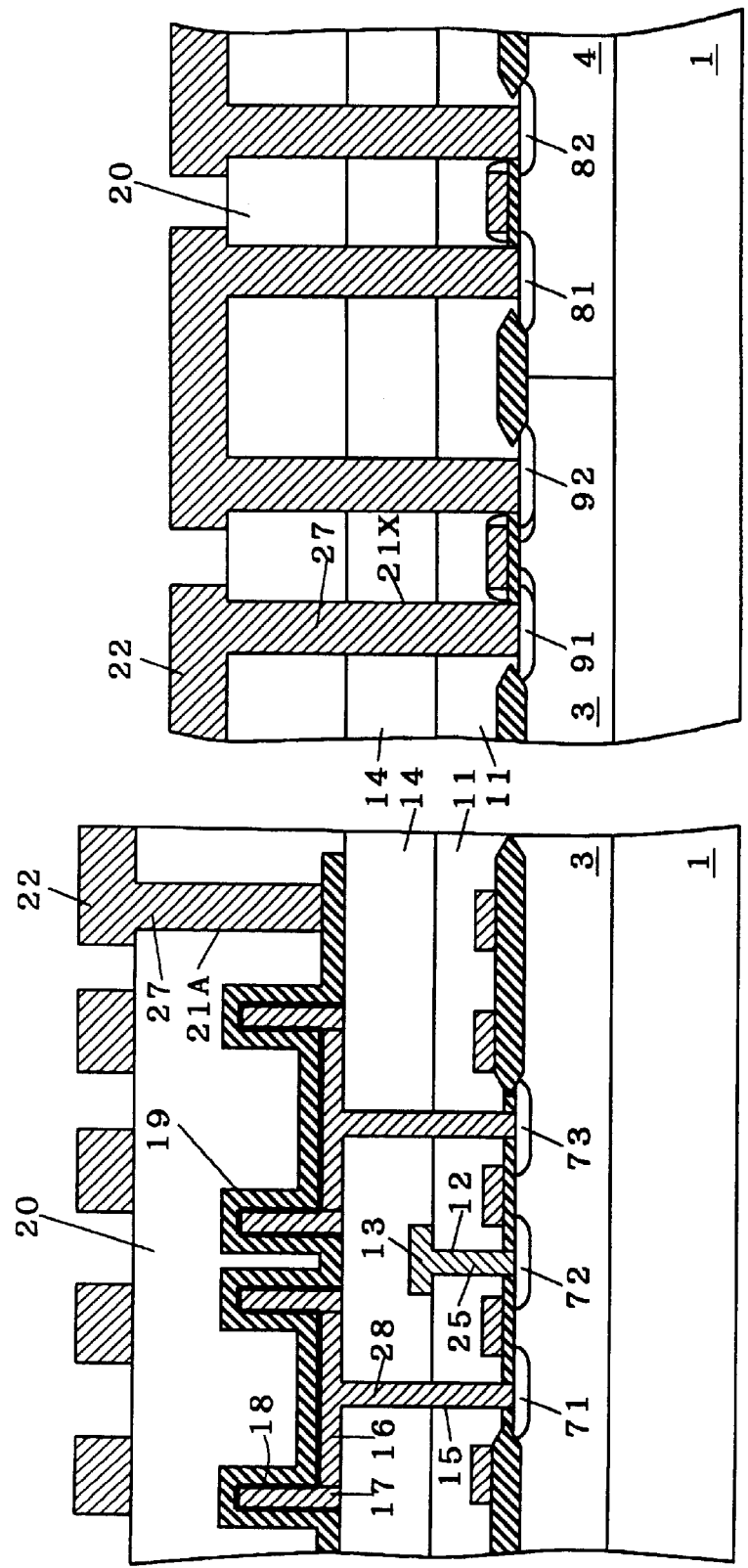

SEMICONDUCTOR DEVICE AND METHOD OF FABRICATING SEMICONDUCTOR DEVICE

BACKGROUND OF THE INVENTION

1. Field of the Invention

The present invention relates to a semiconductor device and a method of fabricating the same, and more particularly, it relates to a semiconductor device comprising a memory cell part having stacked capacitor cells and a peripheral circuit part comprising a logic circuit etc. which are mixed on a single substrate and a method of fabricating semiconductor device.

2. Description of the Background Art

In relation to a semiconductor device, particularly a dynamic RAM (DRAM), three-dimensionalization of memory cells has been attempted following the 4-M (mega) DRAM generation with development of improvement in integration and capacitance, in order to maintain soft error resistance and assurance of capacitance. Structures for such three-dimensionalization of memory cells have been wed out with development of the DRAM generation, and are now being intensified to stacked capacitor cells and trench capacitor cells.

Contrarily to the trench capacitor cells which are prepared by forming grooves in a silicon substrate for ensuring capacitances by depths thereof, stacked capacitor cells are prepared by forming capacitors on a silicon substrate in a stacked manner for ensuring capacitances by the heights thereof. Typical examples thereof are thick film stacked capacitor cells which have been employed since the 16-M DRAM generation, and cylindrical and fin capacitor cells which have been employed since the 64-M DRAM generation. Among these stacked capacitor cells, the structures of and fabrication steps for cylindrical capacitor cells are now described with reference to FIGS. 39A and 39B to 41A and 41B.

FIG. 39A is a partial sectional view showing a memory cell part (data holding part) of a DRAM, and FIG. 39B is a partial sectional view showing a peripheral circuit part of a logic circuit, a sense amplifier, a decoder etc. formed around the memory cell part of the DRAM.

First, description is made on the structure of the memory cell part before formation of aluminum wires with reference to FIG. 39A.

Referring to FIG. 39A, a P-type well region 3 is formed on a P-type silicon substrate 1. N-type source/drain regions 71, 72 and 73 are selectively formed in a surface of the P-type well region 3. In order to electrically isolate these N-type source/drain regions 71, 72 and 73 from other semiconductor regions, field oxide films 2 are selectively formed. A gate oxide film 5 is formed on the N-type source/drain regions 71, 72 and 73.

Gate electrodes 6 are formed over edge upper portions of the N-type source/drain regions 71 and 72 and those of the N-type source/drain regions 72 and 73 through the gate oxide film 5, while word lines 61 formed in the same step as the gate electrodes 6 are arranged on upper portions of the field oxide films 2.

On an upper portion of the P-type well region 3, an interlayer insulating film 11 is formed to cover the gate electrodes 6, the word lines 61 and the remaining structures. A bit line 13 is selectively formed on an upper portion of the interlayer insulating film 11, while a bit line contact hole 12 which is formed through the interlayer insulating film 11 and the gate oxide film 5 while having a buried layer 25 in its interior is provided between the bit line 13 and the N-type source/drain region 72, to electrically connect the same with each other.

Another interlayer insulating film 14 is formed on an upper portion of the interlayer insulating film 11. Storage nodes SN forming cylindrical capacitors are selectively formed on an upper portion of the interlayer insulating film 14. The storage nodes SN are formed by bottom surface films 16 serving as bottom portions and side surface films 17 formed around the bottom surface films 16 for serving as side wall portions. Between the bottom surface films 16 of the two storage nodes SN and the N-type source/drain regions 71 and 73, storage node contact holes 15 having buried layers 28 therein are formed through the interlayer insulating films 14 and 11 and the gate oxide film 5.

Surfaces of the storage nodes SN are covered with capacitor gate oxide films 18, while cell plate electrodes 19 are formed to further cover outer sides thereof. The cell plate electrodes 19 are formed to cover the storage nodes SN in response to the contour shapes thereof.

Still another interlayer insulating film 20 is formed on an upper portion of the interlayer insulating film 14, to cover the cell plate electrodes 19.

The structure of the peripheral circuit part before formation of aluminum wires is now described with reference to FIG. 39B.

Referring to FIG. 39B, P-type and N-type well regions 3 and 4 are formed on the P-type silicon substrate 1. N-type source/drain regions 74 and 75 are selectively formed in the surface of the P-type well region 3, and N$^+$-type source/drain regions 91 and 92 are selectively formed in these N-type source/drain regions 74 and 75. On the other hand, P$^+$-type source/drain regions 81 and 82 are selectively formed in a surface of the N-type well region 4. Field oxide films 2 are selectively formed in the surface of the N-type well region 4.

The gate oxide film 5 is formed on upper portions of the N-type source/drain regions 74 and 75, the N$^+$-type source/drain regions 91 and 92 and the P$^+$-type source/drain regions 81 and 82.

Gate electrodes 6 are formed through the gate oxide film 5 over edge upper portions of the N$^+$-type source/drain regions 91 and 92 and those of the P$^+$-type source/drain regions 81 and 82, and side wall oxide films 10 are formed on both ends of the gate electrodes 6.

The interlayer insulating film 11 is formed on upper portions of the P-type and N-type well regions 3 and 4 to cover the gate electrodes 6 and the remaining structures, while the interlayer insulating films 14 and 20 are successively formed on the upper portion of the interlayer insulating film 11.

Generally in a DRAM which is improved in the degree of integration and capacitance, high resolution is required in photolithography and hence the focus margin is reduced as a tradeoff therefor.

If height difference in a pattern step portion is so increased following improvement in integration and capacitance that its magnitude exceeds the focus margin, therefore, it is extremely difficult to form wires by photolithography. Particularly in stacked capacitor cells formed by stacking capacitors on a silicon substrate, the height difference in the pattern step portions is remarkable.

Further, the wires are easy to disconnect if the height difference in the pattern step portion is increased, and it is necessary and indispensable to reduce the height difference to the minimum. In the DRAM described with reference to FIGS. 39A and 39B, therefore, the interlayer insulating films 11, 14 and 20 are flattened.

However, such flattening of the interlayer insulating films causes new problems in the structure and fabrication steps of the DRAM. These problems are now described with reference to FIGS. 40A, 40B, 41A and 41B showing steps of forming aluminum wires.

FIGS. 40A and 40B show a step of forming contact holes 21A and 21X for connecting the cell plate electrodes 19 of the memory cell part and the $N^+$-type source/drain regions 91 and 92 and the $P^+$-type source/drain regions 81 and 82 of the peripheral circuit part described with reference to FIGS. 39A and 39B to aluminum wires.

On the other hand, FIGS. 41A and 41B show a step of forming aluminum wires 22 on upper portions of the interlayer insulating film 20 while simultaneously burying the aluminum wires 22 in the contact holes 21A and 21X as buried layers 27. Those buried as the buried layers 27 are not restricted to the aluminum wires 22, but may be prepared from any ones so far as the same are conductor layers of metals or the like.

Referring to FIG. 40A, the contact hole 21A is formed through the interlayer insulating film 20 to reach the cell plate electrode 19. Referring to FIG. 40B, the contact holes 21X are formed through the interlayer insulating films 20, 14 and 11 to reach the $N^+$-type source/drain regions 91 and 92 and the $P^+$-type source/drain regions 81 and 82.

As clearly understood from FIGS. 40A and 40B, the height of the memory cell part is larger than that of the peripheral circuit part. This results from the fact that the memory cell part has the stacked capacitor cells.

Applicants determined that since the contact holes 21X in the peripheral circuit part must be formed deeper than the contact hole 21A in the memory cell part due to the height difference, inconvenience by overetching results from the difference between the depths of the contact holes 21A and 21X.

Applicants also determined that when formation of the contact holes 21A and 21X is simultaneously performed in the same etching step, and hence such a situation occurs that etching of the deeper ones (the contact holes 21X) is not completed even if that of the shallower one (the contact hole 21A) is completed, and the etching is continued resulting in the thickness of electrode 19 being reduced or an actual breaking of that electrode.

The second problem discovered by Applicants was the occurrence of inconvenience resulting from the fact that the aspect ratio of the contact hole 21X is extremely increased.

In general, barrier metal layers are formed on inner wall surfaces of contact holes in advance of burying of conductor layers in the contact holes, and hence the conductor layers are buried in holes having inner diameter dimensions obtained by subtracting the thicknesses of the barrier metal layers from the inner diameter dimensions of the contact holes. Considering this, it is only assumed that burying is difficult if the aspect ratio exceeds 5 in the present circumstances.

If the inner diameters of the contact holes 21X are so large that the thicknesses of the barrier metal layers are negligible or the depths of the contact holes 21X are small, therefore, it is not difficult to bury the aluminum wires 22 in the contact holes 21X. In practice, however, applicants found that the aspect ratio was so extremely increased that the conductor layers cannot be stably buried in process and the aluminum wires and diffusion layers cannot be electrically stably connected with each other.

SUMMARY OF THE INVENTION

According to a first aspect of the present invention, a semiconductor device comprises a data holding part having a stacked capacitor as a capacitive element for storing charges and holding data by storing charges in the stacked capacitor and a peripheral circuit part operating in association with the data holding part on a common semiconductor substrate, while the data holding part comprises a first part of a first interlayer insulating film which is formed on the semiconductor substrate, a first bit line contact hole which is formed through the first part of the first interlayer insulating film to electrically connect a bit line which is formed on the first part of the first interlayer insulating film with the semiconductor substrate and has a first bit line buried layer of the same material as the bit line in its interior, a first part of a second interlayer insulating film which is formed on the first part of the first interlayer insulating film to cover the bit line, a storage node which is formed on the first part of the second interlayer insulating film for forming the stacked capacitor, a capacitor gate insulating film which is formed to cover a surface of the storage node, a plate electrode which is formed to cover at least the storage node and the capacitor gate insulating film, first connection means for electrically connecting the storage node with the semiconductor substrate, a first part of a third interlayer insulating film which is formed on the first part of the second interlayer insulating film to cover the plate electrode, and a first metal wire contact hole which is formed through the first part of the third interlayer insulating film to electrically connect a first metal wire layer which is formed on the first part of the third interlayer insulating film with the plate electrode and has a first metal buried layer in its interior, and the peripheral circuit part comprises a first conductivity type first semiconductor region and a second conductivity type second semiconductor region which is selectively formed in the semiconductor substrate, second parts of the first to third interlayer insulating films, a second metal wire contact hole which is formed through at least the second part of the third interlayer insulating film, having a second metal buried layer in its interior, and connected to the second metal wire layer, and second connection means for electrically connecting the second metal buried layer in the second metal wire contact hole with the first and second semiconductor regions. The second metal wire contact hole has a depth which is substantially identical to that of the first metal wire contact hole.

According to a second aspect of the present invention, the first connection means is provided with a first storage node contact hole which is formed through the first parts of the first and second interlayer insulating films to reach the semiconductor substrate, and a first storage node buried layer of the same material as the storage node which is formed in its interior, and the second connection means is provided with a second bit line contact hole which is formed through the second part of the first interlayer insulating film, and a second bit line buried layer of the same material as the bit line which is formed in its interior.

According to a third aspect of the present invention, the first connection means is provided with a first storage node contact hole which is formed through the first parts of the first and second interlayer insulating films to reach the semiconductor substrate, and a first storage node buried layer of the same material as the storage node which is formed in its interior, and the second connection means is provided with a second bit line contact hole which is formed through the second part of the first interlayer insulating film in the same step as the first bit line contact hole, and a second bit line buried layer of the same material as the bit line which is formed in its interior, and a second storage node contact hole which is formed through the second part of the second interlayer insulating film, and a second storage node buried layer of the same material as the storage node which is formed in its interior.

According to a fourth aspect of the present invention, the first connection means is provided with a third bit line contact hole which is formed through the first part of the first interlayer insulating film, and a third bit line buried layer of the same material as the bit line which is formed in its interior, and a third storage node contact hole which is formed through the first part of the second interlayer insulating film, and a third storage node buried layer of the same material as the storage node which is formed in its interior, and the second connection means is provided with a second bit line contact hole which is formed through the second part of the first interlayer insulating film, and a second bit line buried layer of the same material as the bit line which is formed in its interior, and a fourth storage node contact hole which is formed through the second part of the second interlayer insulating film, and a fourth storage node buried layer of the same material as the storage node which is formed in its interior.

According to a fifth aspect of the present invention, the second bit line buried layer is a polysilicon layer containing a first conductivity type impurity of relatively high concentration, and the peripheral circuit part comprises a metal silicide film which is formed on at least the second semiconductor region.

According to a sixth aspect of the present invention, the first connection means is provided with a first storage node contact hole which is formed through the first parts of the first and second interlayer insulating films to reach the semiconductor substrate, and a first storage node buried layer of the same material as the storage node which is formed in its interior, and the second connection means is provided with a fifth storage node contact hole which is formed through the second parts of the first and second interlayer insulating films, and a fifth storage node buried layer of the same material as the storage node which is formed in its interior.

According to a seventh aspect of the present invention, the fifth storage node buried layer is a polysilicon layer containing a first conductivity type impurity of relatively high concentration, and the peripheral circuit part comprises a metal silicide film which is provided on at least the second semiconductor region.

According to an eighth aspect of the present invention, a method of fabricating a semiconductor device comprising a data holding part having a stacked capacitor as a capacitive element for storing charges and holding data by storing charges in the stacked capacitor and a peripheral circuit part operating in association with the data holding part on a common semiconductor substrate comprises the steps of (a) forming a first part and a second part of a first interlayer insulating film on the data holding part and the peripheral circuit part on the semiconductor substrate, (b) forming a first bit line contact hole passing through the first part of the first interlayer insulating film and reaching the semiconductor substrate in the data holding part, and thereafter forming a bit line on the first part of the first interlayer insulating film while forming a first bit line buried layer of the same material as the bit line in the first bit line contact hole for electrically connecting the bit line with the semiconductor substrate, (c) forming a first part of a second interlayer insulating film on the first part of the first interlayer insulating film and forming a storage node for structuring the stacked capacitor on the first part of the second interlayer insulating film, while forming first connection means for electrically connecting the storage node with the semiconductor substrate, (d) forming a capacitor gate insulating film to cover a surface of the storage node and thereafter forming a plate electrode to cover at least the storage node and the capacitor gate insulating film, (e) forming a first part of a third interlayer insulating film on the first part of the second interlayer insulating film to cover the plate electrode, forming a first metal wire contact hole passing through the first part of the third interlayer insulating film and reaching the plate electrode, and thereafter forming a first metal wire layer on the first part of the third interlayer insulating film while forming a first metal buried layer in the first metal wire contact hole, for electrically connecting the metal wire layer with the plate electrode, (f) forming second parts of the second and third interlayer insulating films in the peripheral circuit part, (g) forming second connection means which is connected to a first conductivity type first semiconductor region and a second conductivity type second semiconductor region which is selectively formed in the semiconductor substrate in the peripheral circuit part, and (h) forming a second metal wire contact hole passing through at least the second part of the third interlayer insulating film and reaching the second connection means, forming a second metal wire layer on the second part of the third interlayer insulating film and forming a second metal buried layer in the second metal wire contact hole for connecting the same to the second connection means, thereby electrically connecting the second metal wire layer with the first and second semiconductor regions. The second metal wire contact hole is formed in the same step as the first metal wire contact hole to have a depth which is substantially identical to that of the first metal wire contact hole.

According to a ninth aspect of the present invention, the step of forming the first connection means in the step (c) comprises the step of forming a first storage node contact hole to pass through the first parts of the first and second interlayer insulating films and reach the semiconductor substrate in advance of the formation of the storage node, forming the storage node on the first part of the second interlayer insulating film, and forming a first storage node buried layer of the same material as the storage node in the first storage node contact hole, and the step of forming the second connection means in the step (g) comprises the steps of forming the first bit line contact hole in the data holding part while simultaneously forming a second bit line contact hole passing through the second part of the first interlayer insulating film and reaching the first and second semiconductor regions also in the peripheral circuit part, and forming the first bit line buried layer in the data holding part while simultaneously forming a second bit line buried layer of the same material as the bit line in the second bit line contact hole also in the peripheral circuit part.

According to a tenth aspect of the present invention, the step of forming the first connection means in the step (c) comprises the step of forming a first storage node contact hole to pass through the first parts of the first and second interlayer insulating films and reach the semiconductor substrate in advance of the formation of the storage node, forming the storage node on the first part of the second interlayer insulating film and forming a first storage node buried layer of the same material as the storage node in the first storage node contact hole, and the step of forming the second connection means in the step (g) comprises the steps of forming the first bit line contact hole in the data holding part while simultaneously forming a second bit line contact hole passing through the second part of the first interlayer insulating film and reaching the first and second semiconductor regions also in the peripheral circuit part, forming the first bit line buried layer in the data holding part while simultaneously forming a second bit line buried layer of the same material as the bit line in the second bit line contact hole also in the peripheral circuit part, forming the first storage node contact hole in the data holding part while simultaneously forming a second storage node contact hole passing through the second part of the second interlayer insulating film and reaching the second bit line buried layer in the second bit line contact hole also in the peripheral circuit part, and forming the first storage node buried layer in the data holding part while simultaneously forming a second storage node buried layer in the second storage node contact hole also in the peripheral circuit part.

According to an eleventh aspect of the present invention, the step of forming the first connection means in the step (c) comprises the steps of forming the first bit line contact hole while simultaneously forming a third bit line contact hole passing through the first part of the first interlayer insulating film and reaching the semiconductor substrate, forming the first bit line buried layer while simultaneously forming a third bit line of the same material as the bit line also in the third bit line contact hole, forming a third storage node contact hole to pass through the first part of the second interlayer insulating film and reach the third bit line buried layer in the third bit line contact hole in advance of the formation of the first storage node, and forming the storage node on the first part of the second interlayer insulating film while forming a third storage node buried layer of the same material as the storage node in the third storage node contact hole, and the step of forming the second connection means in the step (g) comprises the steps of forming the first bit line contact hole in the data holding part while simultaneously forming a second bit line contact hole passing through the second part of the first interlayer insulating film and reaching the first and second semiconductor regions also in the peripheral circuit part, forming the first bit line buried layer in the data holding part while simultaneously forming a second bit line buried layer of the same material as the bit line in the second bit line contact hole also in the peripheral circuit part, forming the third storage node contact hole in the data holding part while simultaneously forming a fourth storage node contact hole passing through the second part of the second interlayer insulating film and reaching the second bit line buried layer in the second bit line contact hole also in the peripheral circuit part, and forming the third storage node buried layer in the data holding part while simultaneously forming a fourth storage node buried layer of the same material as the storage node in the fourth storage node contact hole also in the peripheral circuit part.

According to a twelfth aspect of the present invention, the second bit line buried layer is formed by a polysilicon layer containing a first conductivity type impurity of relatively high concentration, and the step (a) comprises the step of forming a prescribed metal film on at least the second semiconductor region and thereafter performing lamp heating for silicifying the prescribed metal film before forming the first part of the first interlayer insulating film, thereby forming a metal silicide film on at least the second semiconductor region.

According to a thirteenth aspect of the present invention, the step of forming the first connection means in the step (c) comprises the step of forming a first storage node contact hole to pass through the first parts of the first and second interlayer insulating films and reach the semiconductor substrate in advance of the formation of the storage node, forming the storage node on the first part of the second interlayer insulating film, and forming a first storage node buried layer of the same material as the storage node in the first storage node contact hole, and the step of forming the second connection means in the step (h) comprises the steps of forming the first storage node contact hole in the data holding part while simultaneously forming a fifth storage node contact hole passing through the second parts of the first and second interlayer insulating films and reaching the first and second semiconductor regions also in the peripheral circuit part, and forming the first storage node buried layer in the data holding part while simultaneously forming a fifth storage node buried layer of the same material as the storage node in the fifth storage node contact hole also in the peripheral circuit part.

According to a fourteenth aspect of the present invention, the fifth storage node buried layer is formed by a polysilicon layer containing a first conductivity type impurity of relatively high concentration, and the step (a) comprises the step of forming a prescribed metal film on at least the second semiconductor region and thereafter performing lamp heating for silicifying the prescribed metal film before forming the first part of the first interlayer insulating film, thereby forming a metal silicide film on at least the second semiconductor region. In the semiconductor device according to the first aspect of the present invention, the first and second semiconductor regions are electrically connected with the metal wire layer by the second metal wire contact hole and the second connection means, whereby the depth of the second metal wire contact hole can be rendered substantially identical to that of the first metal wire contact hole, and it is possible to prevent inconvenience resulting from difference between the depths, e.g., such a situation that the plate electrode is overetched when the second metal wire contact hole is deeper than the first metal wire contact hole. The aspect ratio of the second metal wire contact hole is reduced, whereby the metal wire layer can be stably buried in process, so that the metal wire layer can be electrically stably connected with the first and second semiconductor regions.

In the semiconductor device according to the second aspect of the present invention, the second connection means is formed by the second bit line contact hole and the second bit line buried layer which is formed in its interior, whereby the second connection means can be simultaneously formed with formation of the first bit line contact hole in the data holding part.

In the semiconductor device according to the third aspect of the present invention, the first connection means is formed by the first storage node contact hole and the first storage node buried layer which is formed in its interior in the data holding part while the second connection means is formed by the second bit line contact hole and the second bit line buried layer which is formed in its interior as well as the second storage node contact hole which is formed in the same step as the first storage node contact hole and the second storage node buried layer which is formed in its interior in the peripheral circuit part, whereby the second connection means can be simultaneously formed by forming the first bit line contact hole and forming the first connection means in the data holding part.

In the semiconductor device according to the fourth aspect of the present invention, the first connection means is formed by the third bit line contact hole and the third bit line buried layer which is formed in its interior as well as the third storage node contact hole and the third storage node buried layer which is formed in its interior in the data holding part while the second connection means is formed by the second bit line contact hole and the second bit line buried layer which is formed in its interior as well as the fourth storage node contact hole and the fourth storage node buried layer which is formed in its interior in the peripheral circuit part, whereby the first and second connection means can be simultaneously formed in the absolutely identical step.

In the semiconductor device according to the fifth aspect of the present invention, the metal silicide film is provided on at least the second semiconductor region of the peripheral circuit part when the second bit line buried layer is a polysilicon layer containing a first conductivity type impurity of relatively high concentration, whereby it is possible to prevent such a problem that no current flows due to different conductivity types of the second semiconductor region and the first and third buried layers. When the metal silicide film is provided between the first semiconductor region and the first and third buried layers, contact resistance is reduced to enable a high-speed operation. When no metal silicide film is provided between the first semiconductor region and the first and third buried layers, on the other hand, it is possible to prevent current leakage at the junctions.

In the semiconductor device according to the sixth aspect of the present invention, the first connection means is formed by the first storage node contact hole and the first storage node buried layer of the same material as the storage node which is formed in its interior in the data holding part while the second connection means is formed by the fifth storage node contact hole and the fifth storage node buried layer which is formed in its interior in the peripheral circuit part, whereby the second connection means can be simultaneously formed with formation of the first connection means.

In the semiconductor device according to the seventh aspect of the present invention, the metal silicide film is provided on at least the second semiconductor region of the peripheral circuit part when the fifth storage node buried layer is a polysilicon layer containing a first conductivity type impurity of relatively high concentration, whereby it is possible to prevent such a problem that no current flows due to different conductivity types of the second semiconductor region and the first and third buried layers. When the metal silicide film is provided between the first semiconductor region and the first and third buried layers, contact resistance is reduced to enable a high-speed operation. When no metal silicide film is provided between the first semiconductor region and the first and third buried layers, on the other hand, it is possible to prevent current leakage at the junctions.

In the method of fabricating a semiconductor device according to the eighth aspect of the present invention, the depth of the second metal wire contact hole can be rendered substantially identical to that of the first metal wire contact hole, and it is possible to prevent inconvenience resulting from difference between the depths, e.g., such a situation that the plate electrode is overetched when the second metal wire contact hole is deeper than the first metal wire contact hole.

In the method of fabricating a semiconductor device according to the ninth aspect of the present invention, it is possible to obtain a concrete fabrication method for simultaneously forming the second connection means in case of forming the first bit line contact hole in the data holding part and forming the first bit line buried layer therein.

In the method of fabricating a semiconductor device according to the tenth aspect of the present invention, it is possible to form the second connection means by forming the first bit line contact hole and forming the first connection means in the data holding part.

In the method of fabricating a semiconductor device according to the eleventh aspect of the present invention, it is possible to obtain a concrete fabrication method for simultaneously forming the first and second connection means in the absolutely identical step.

In the method of fabricating a semiconductor device according to the twelfth aspect of the present invention, it is possible to obtain a concrete fabrication method for forming the metal silicide film on at least the second semiconductor region of the peripheral circuit part.

In the method of fabricating a semiconductor device according to the thirteenth aspect of the present invention, it is possible to obtain a concrete fabrication method for simultaneously forming the second connection means in formation of the first connection means.

In the method of fabricating a semiconductor device according to the fourteenth aspect of the present invention, it is possible to obtain a concrete fabrication method for forming the metal silicide film on at least the second semiconductor region of the peripheral circuit part.

Accordingly, an object of the present invention is to provide a semiconductor device preventing occurrence of inconvenience resulting from overetching due to difference between depths of contact holes simultaneously formed in a memory cell part and a peripheral circuit part and occurrence of inconvenience resulting from the fact that an aspect ratio of the contact holes is extremely increased, and a method of fabricating the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are sectional views for illustrating fabrication steps according to an embodiment 1 of the present invention;

FIGS. 3A and 3B are sectional views for illustrating fabrication steps according to the embodiment 1 of the present invention;

FIGS. 5A and 5B are sectional views for illustrating fabrication steps according to the embodiment 1 of the present invention;

FIGS. 7A and 7B are sectional views for illustrating fabrication steps according to the embodiment 1 of the present invention;

FIGS. 9A and 8B are sectional views for illustrating fabrication steps according to the embodiment 1 of the present invention;

FIGS. 10A and 10B are sectional views for illustrating fabrication steps according to the embodiment 1 of the present invention;

FIGS. 13A and 13B are sectional views for illustrating fabrication steps according to the embodiment 2 of the present invention;

FIGS. 16A and 16B are sectional views for illustrating fabrication steps according to the embodiment 2 of the present invention;

FIGS. 19A and 19B are sectional views for illustrating fabrication steps according to the embodiment 2 of the present invention;

FIGS. 22A and 22B are sectional views for illustrating fabrication steps according to the embodiment 3 of the present invention;

FIGS. 25A and 25B are sectional views for illustrating fabrication steps according to the embodiment 3 of the present invention;

FIGS. 28A and 28B are sectional views for illustrating fabrication steps according to the embodiment 4 of the present invention;

FIGS. 29A and 29B are sectional views for illustrating fabrication steps according to the embodiment 4 of the present invention;

FIGS. 30A and 30B are sectional views for illustrating fabrication steps according to the embodiment 4 of the present invention;

FIGS. 31A and 31B are sectional views for illustrating fabrication steps according to an embodiment 5 of the present invention;

FIGS. 33A and 33B are sectional views for illustrating fabrication steps according to the embodiment 5 of the present invention;

FIGS. 35A and 35B are sectional views for illustrating fabrication steps according to the embodiment 5 of the present invention;

FIGS. 40A and 40B are sectional views for illustrating fabrication steps of a conventional semiconductor device; and FIGS. 41A and 41B are sectional views for illustrating fabrication steps of a conventional semiconductor device.

DESCRIPTION OF THE PREFERRED EMBODIMENTS

<A. Embodiment 1>

<A-1. Fabrication Steps>

Figure 2B:
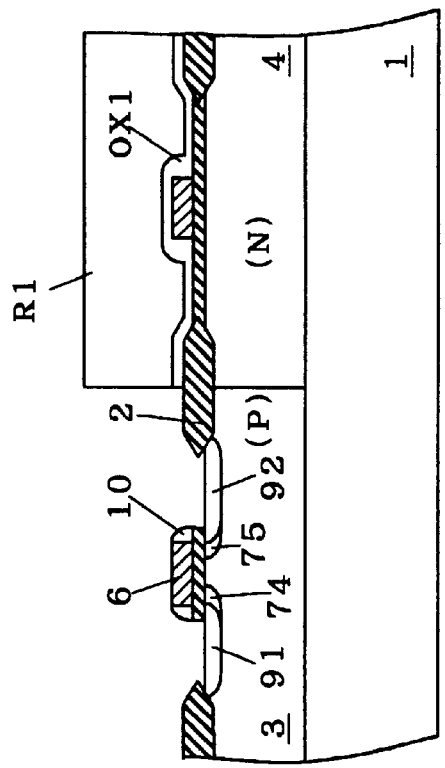
FIGS. 2A and 2B are sectional views for illustrating fabrication steps according to the embodiment 1 of the present invention.

As an embodiment 1 according to the present invention, a method of fabricating a semiconductor device having cylindrical capacitor cells is successively described with reference to FIGS. 1A and 1B to 10A and 10B, and its characteristic functions/effects are described with reference to FIGS. 10A and 10B showing final steps.

FIG. 1A is a partial sectional view showing a memory cell part (data holding part) of a DRAM, and FIG. 1B is a partial sectional view showing a peripheral circuit part comprising a sense amplifier, a decoder and the like which is formed around the memory cell part of the DRAM.

In steps shown in FIGS. 1A and 1B, field oxide films 2 are first selectively formed in a P-type silicon semiconductor substrate 1.

Then, P-type and N-type impurity ions are selectively implanted through a mask of a resist film (not shown) respectively, thereby forming a P-type well region 3 in the memory cell part, and a P-type well region 3 and an N-type well region 4 in the peripheral circuit part in the P-type silicon semiconductor substrate 1.

Then, gate oxide films 5 are formed on portions of the P-type and N-type well regions 3 and 4 provided with no field oxide films 2, so that gate electrodes 6 are selectively formed on these gate oxide films 5. At this time, word lines 61 are formed on upper portions of the field oxide films 2 in the same step as the gate electrodes 6.

Then, ions of an N-type impurity (As or P) are implanted in a low dosage ($1\times10^{13}$ to $1\times10^{14}$ cm$^{-2}$) into portions of the P-type well region 3 of the memory cell part located immediately under the gate oxide film 5 through masks of the gate electrodes 6, thereby selectively forming N-type source/drain regions 71, 72 and 73, while selectively forming N-type source/drain regions 74 and 75 in portions of the p-type well region 3 of the peripheral circuit part located immediately under the gate oxide film 5.

Figure 2A:
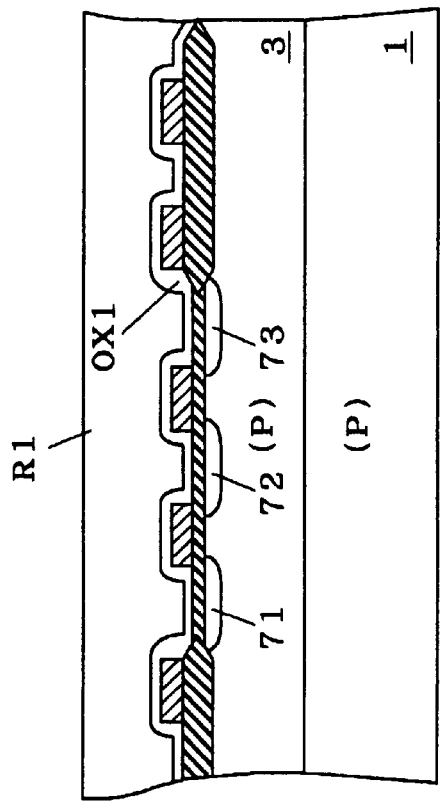

Then, an oxide film OX1 is formed along the overall surface, a resist film R1 is formed on regions excluding the upper portion of the P-type well region 3 of the peripheral circuit part, and the oxide film OX1 is etched back through the resist film R1 serving as a mask, thereby forming side wall oxide films 10 on both sides of the gate electrode 6 on the P-type well region 3 of the peripheral circuit part, in steps shown in FIGS. 2A and 2B.

The gate electrode 6 and the side wall oxide films 10 provided on the P-type well region 3 of the peripheral circuit part and the resist film R1 are employed as masks for implanting N-type impurity ions into the N-type source/drain regions 74 and 75 in a high dosage ($1\times10^{15}$ to $4\times10^{15}$ cm$^{-2}$), thereby forming N$^+$-type source/drain regions 91 and 92.

Then, the resist film R1 is removed, and a resist film R2 is formed on regions excluding the upper portion of the N-type well region 4 of the peripheral circuit part for etching back the oxide film OX1 through the resist film R2 serving as a mask, thereby forming side wall oxide films 10 on both sides of the gate electrode 6 on the N-type well region 4 of the peripheral circuit part, in steps shown in FIGS. 3A and 3B.

The gate electrode 6 and the side wall oxide films 10 provided on the N-type well region 4 of the peripheral circuit part and the resist film R2 are employed as masks to implant ions of a P-type impurity (B or BF$_2$) into the N-type well region 4 in a high dosage ($1\times10^{15}$ to $4\times10^{15}$ cm$^{-2}$), thereby forming P$^+$-type source/drain regions 81 and 82.

Figure 4B:
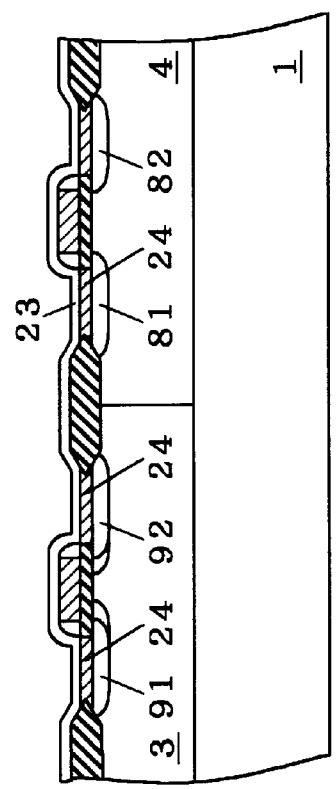
FIGS. 4A and 4B are sectional views for illustrating fabrication steps according to the embodiment 1 of the present invention.
Figure 4A:
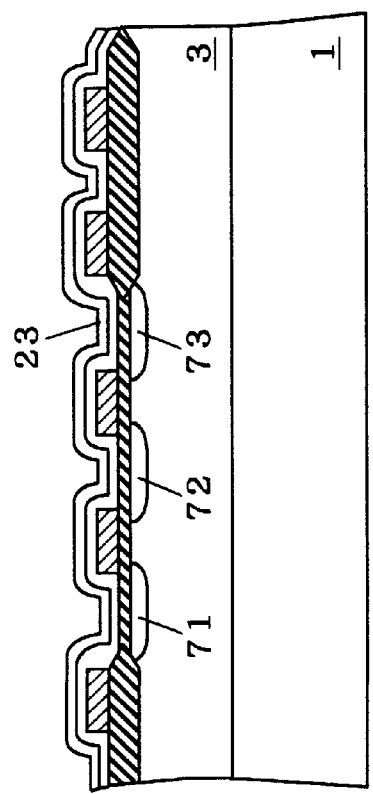

Then, the resist film R2 is removed, so that a high melting point metal film 23 is formed on the overall surface by W (tungsten), Ti (titanium), Co (cobalt), Ni (nickel) or the like and selectively silicified by RTA (rapid thermal annealing) of heat treating the semiconductor substrate 1 at a high temperature by lamp heating or the like, in steps shown in FIGS. 4A and 4B.

At this time, portions of the peripheral circuit part exposing the N$^+$-type source/drain regions 91 and 92 and the P$^+$-type source/drain regions 81 and 82 are silicified so that high melting point metal silicide films 24 of WSi$_2$, TiSi$_2$, CoSi$_2$ or NiSi$_2$ or the like, for example, are formed on these portions.

While the structure of each gate electrode 6 is not concretely illustrated, the upper portion of the gate electrode 6 of the peripheral circuit part is not silicified if the gate electrode 6 is formed by a conductive film such as a polysilicon film into which a semiconductor impurity is introduced, for example, and an insulating film (an oxide or nitride film) formed thereon, and the upper portion of the gate electrode 6 of the peripheral circuit part is silicified if the gate electrode 6 is formed by only a silicon conductor film such as a polysilicon film into which a semiconductor impurity is introduced, for example.

Then, the high melting point metal film 23 is removed to leave the high melting point metal silicide films 24 on the upper portions of the N$^+$-type source/drain regions 91 and 92 and the P$^+$-type source/drain regions 81 and 82 of the peripheral circuit part, in steps shown in FIGS. 5A and 5B.

Figures 6A, 6B:
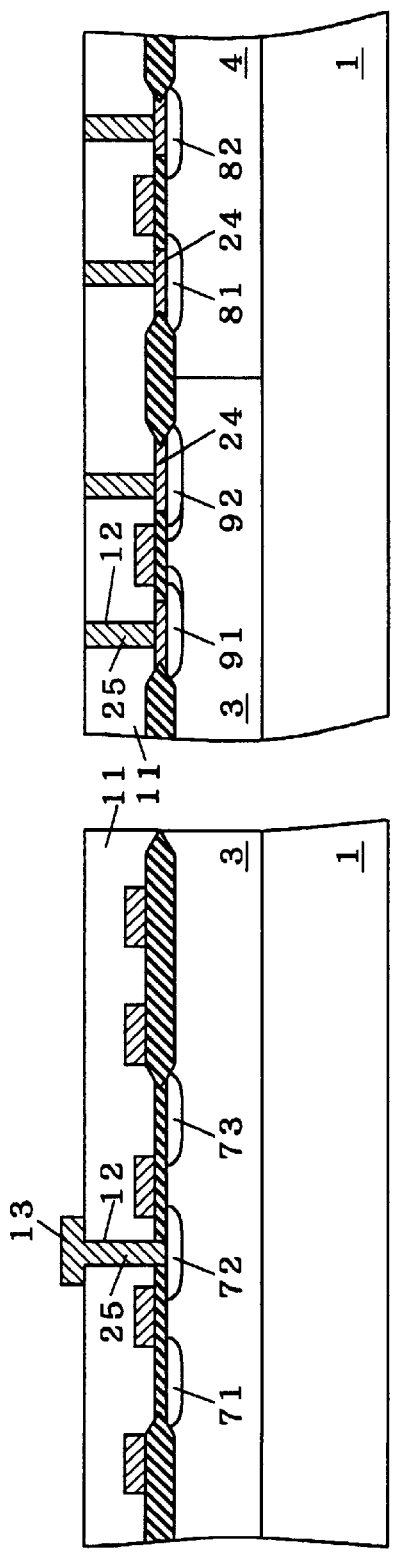
FIGS. 6A and 6B are sectional views for illustrating fabrication steps according the embodiment 1 of the present invention.

Then, an oxide film is formed along the overall surface and flattened for forming an interlayer insulating film 11 (first interlayer insulating film) in steps shown in FIGS. 6A and 6B. The interlayer insulating film 11 is called an interlayer insulating film under a bit line, to be distinguished from other interlayer insulating films. While the interlayer insulating film 11 and interlayer insulating films 14 and 20 illustrated later are simultaneously formed on the memory cell part and the peripheral circuit part by the same material, those formed on the memory cell part and the peripheral circuit part are called first and second portions respectively, to be distinguished from each other.

Then, bit line contact holes 12 (first and second bit line contact holes) passing through the interlayer insulating film 11 are formed to reach the high melting point metal silicide films 24 on the upper portions of the N-type source/drain region 72 in the memory cell part and the N$^+$-type source/drain regions 91 and 92 and the P$^+$-type source/drain regions 81 and 82 in the peripheral circuit part.

Then, following formation of a bit line forming conductor layer along the overall surface of the interlayer insulating film 11, bit line forming conductor layers such as N$^+$ polysilicon layers into which an N-type impurity is introduced in high concentration, for example, are buried in the bit line contact holes 12, for forming buried layers 25 (first and second bit line buried layers).

Through steps of photolithography and etching, the bit line forming conductor layers are removed for forming a bit line 13 at least in the memory cell part while leaving the buried layers 25 in the bit line contact holes 12 in the peripheral circuit part.

The bit line contact holes 12 in the peripheral circuit part, which are not necessarily employed for connection with a bit line, are thus called since the same are formed in the same step as the bit line contact hole 12 in the memory cell part.

Then, an oxide film is formed along the overall surface of the interlayer insulating film 11 and flattened to form the interlayer insulating film 14 (second interlayer insulating film), in steps shown in FIGS. 7A and 7B. The interlayer insulating film 14 is called an interlayer insulating film under storage nodes, to be distinguished from the remaining interlayer insulating films.

Then, storage node contact holes 15 (first storage node contact holes) passing through the interlayer insulating films 11 and 14 are formed to reach the N-type source/drain regions 71 and 73 at least in the memory cell part.

Then, following formation of a storage node forming conductor layer by an N$^+$ polysilicon layer into which an N-type impurity is introduced in high concentration, for example, along the overall surface of the interlayer insulating film 14, storage node forming conductor layers are buried in the storage node contact holes 15, for forming buried layers 28 (first storage node buried layers).

Then, an insulating film is thickly formed along the overall surface, and the storage node forming conductor layer and the thick insulating film are removed through steps of photolithography and etching to leave only bottom surface films 16 forming bottom portions of storage nodes SN and portions of the insulating film located on the bottom surface films 16. The portions of the insulating film located on the bottom surface films 16 are called cylindrical capacitor forming insulating films 26.

Figures 8A, 8B:
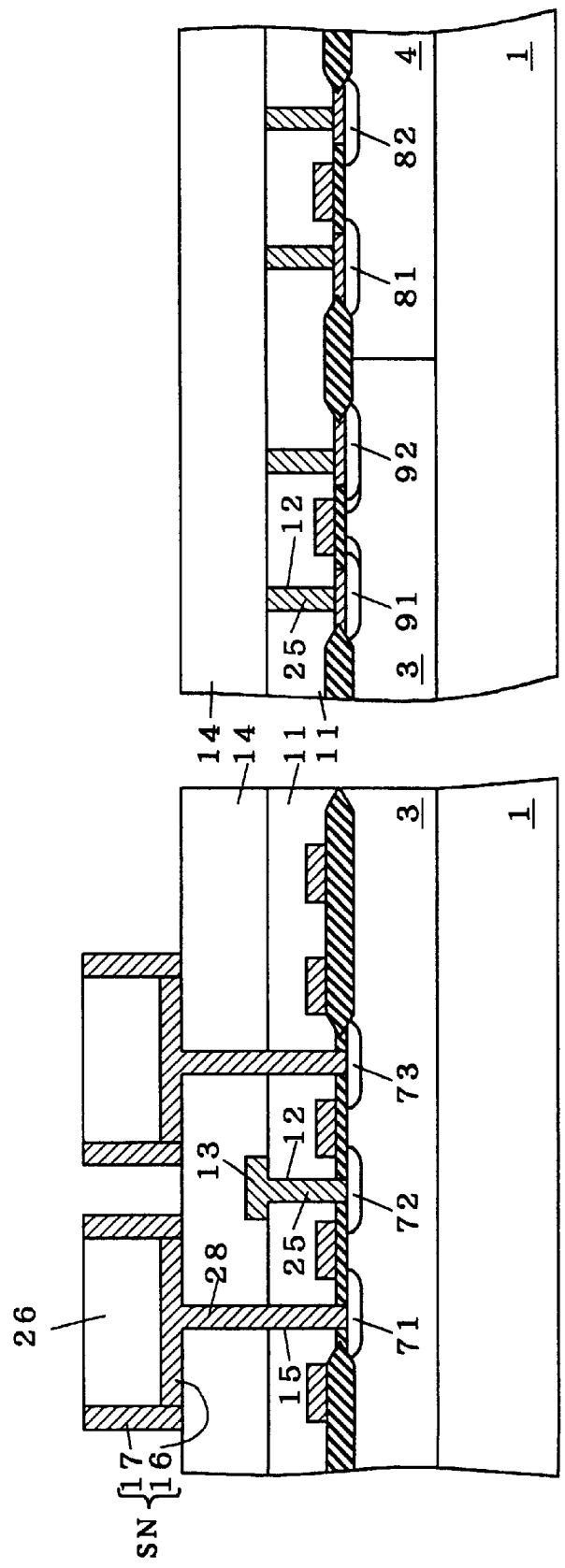
FIGS. 8A and 8B are sectional views for illustrating fabrication steps according to the embodiment 1 of the present invention.

Then, a storage node forming conductor film is formed along the overall surface again, and selectively removed by etchback to be left only in portions around the bottom surface films 16 and the cylindrical capacitor forming insulating films 26, in steps shown in FIGS. 8A and 8B. The left portions of the storage node forming conductor layer define side surface films 17 forming side wall portions of the storage nodes SN. The bottom surface films 16 and the side surface films 17 form the storage nodes SN.

Then, only the cylindrical capacitor forming insulating films 26 are removed, and capacitor gate insulating films 18 are formed on surfaces of the bottom surface films 16 and the side surface films 17 in steps shown in FIGS. 9A and 9B.

A cell plate forming conductor film is formed along the overall surface, and left only in the memory cell part through steps of photolithography and etching. The left portions of the cell plate forming conductor film define cell plate electrodes 19.

Then, an oxide film is formed along the overall surface and flattened to form the interlayer insulating film 20 (third interlayer insulating film) in steps shown in FIGS. 10A and 10B. The interlayer insulating film 20 is called an interlayer under aluminum wire layers, to be distinguished from the remaining interlayer insulating films.

Then, an aluminum wire contact hole 21A (first metal wire contact hole) is formed in the memory cell part to reach the cell plate electrode 19, while aluminum wire contact holes 21B (second metal wire contact holes) passing through the interlayer insulating film 20 are formed on the peripheral circuit part to reach the buried layers 25 in the bit line contact holes 12.

Then, following formation of an aluminum wire forming conductor layer along the overall surface of the interlayer insulating film 20, aluminum wire forming conductor layers are buried in the aluminum wire contact holes 21A and 21B. At this time, buried layers 27 (first and second metal buried layers) are formed in the aluminum wire contact holes 21A and 21B. While the aluminum wire forming conductor layers are buried in the aluminum wire contact holes 21A and 21B in the above description, the same are not restricted to aluminum but may be conductor layers of a metal or the like.

Then, aluminum wires (first and second metal wire layers) 22 are formed on the interlayer insulating film 20 in the memory cell part and the peripheral circuit part, whereby a semiconductor device having cylindrical capacitor cells can be obtained.

Figure 11:
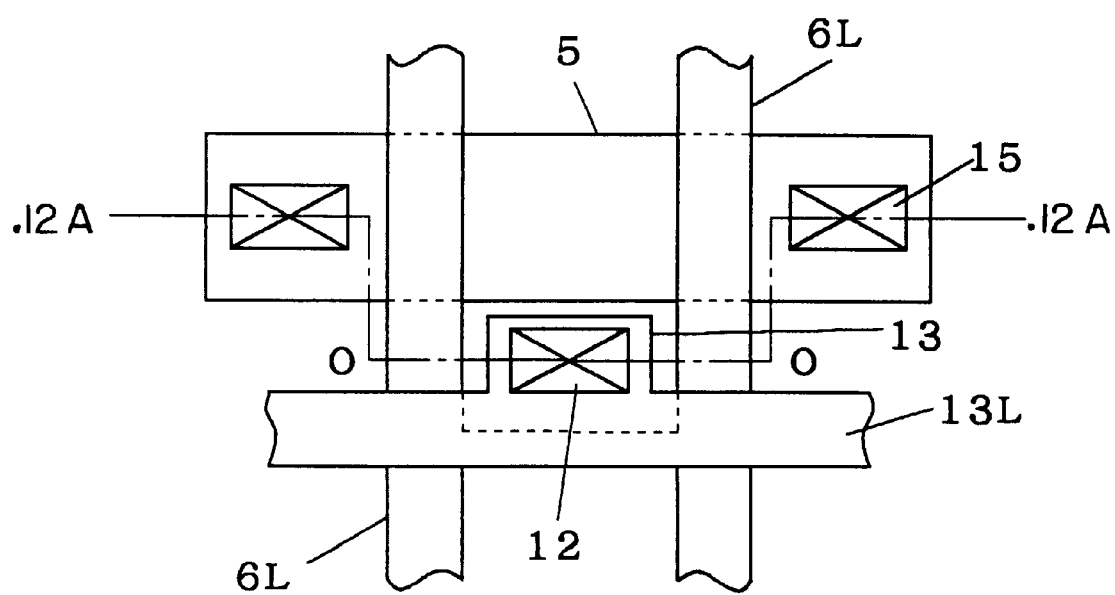
FIG. 11 is a partial plan view for illustrating fabrication steps according to the embodiment 1 of the present invention.

FIG. 11 is a plan view as viewed along the line A—A in FIG. 10A. FIG. 11 also shows invisible wires covered with the interlayer insulating film.

Referring to FIG. 11, the bit line 13 is formed integrally with a BL (bit line) wire 13L, and arranged to cover the bit line contact hole 12. On the other hand, the gate electrodes 6 are formed integrally with TG (transfer gate) wires 6L.

A sectional view taken along the line B–O–O–B in FIG. 11 illustrates a portion under the line A—A in FIG. 10A.

The peripheral circuit part is also provided with TG wires (not shown in FIGS. 1B to 10B) or the like which are formed in the same fabrication process as the word lines 61 (i.e., the gate electrodes 6), and forming positions thereof are in layers substantially identical to the gate electrodes 6. Therefore, the TG wires may be electrically connected with the aluminum wires 22 through the bit line contact holes 12 and the aluminum wire contact holes 21B.

Namely, bit line contact holes (substantially identical to the bit line contact holes 12) passing through the interlayer insulating film 11 and reaching the TG wires are simultaneously formed in formation of the bit line contact holes 12 in the step shown in FIG. 6B, so that bit line forming conductor layers are simultaneously buried in the bit line contact holes reaching the TG wires when the bit line forming conductor layers are buried in the bit line contact holes 12.

In the step shown in FIG. 10B, the aluminum wire contact holes 21B are formed to reach the conductor layers in the bit line contact holes passing through the interlayer insulating film 20 and reaching the TG wires.

The peripheral circuit part is also provided with BL wires (not shown in FIGS. 1B to 10B) or the like which are formed in the same fabrication process as the bit line 13, and the forming positions thereof are in a layer substantially identical to the bit line 13.

<A-2. Characteristic Functions/Effects>

According to the embodiment 1 of the present invention, as hereinabove described, the aluminum wires 22 provided on the interlayer insulating film 20 of the peripheral circuit part are electrically connected with semiconductor diffusion regions, i.e., the $N^+$-type source/drain regions 91 and 92 (first semiconductor regions) and the $P^+$-type source/drain regions 81 and 82 (second semiconductor regions) by the bit line contact holes 12 which are formed through the interlayer insulating film 11 to have the buried layers 25 therein and the aluminum wire contact holes 21B which are formed through the interlayer insulating films 14 and 20 to have the buried layers 27 therein. Therefore, the aluminum wire contact holes 21B in the peripheral circuit part are prevented from being remarkably deeper than the aluminum wire contact holes 21A in the memory cell part, whereby it is possible to prevent such a situation that the cell plate electrodes 19 are overetched due to difference between these depths.

This effect also applies in case of connecting the TG wires with the aluminum wires 22 through the bit line contact holes 12 and the aluminum wire contact holes 21B.

Further, the aspect ratios of the aluminum wire contact holes 21B in the peripheral circuit part can be reduced, the conductor layers can be stably buried in process, and the aluminum wires can be electrically stably connected with the semiconductor diffusion regions.

In addition, contact resistance is reduced to enable a high-speed operation by interposing the high melting point metal silicide films 24 between the buried layers 25 of the bit line contact holes 12 and the $N^+$-type source/drain regions 91 and 92 and the $P^+$-type source/drain regions 81 and 82.

On the other hand, no high melting point metal silicide films 24 are formed on the N-type source/drain regions 71, 72 and 73 of the memory cell part, in order to prevent the amount of discharge of storage charges from increase resulting from increase of leakage currents at junctions due to interposition of the high melting point metal silicide films 24.

<B. Embodiment 2>

<B-1. Fabrication Steps>

Figure 20A:
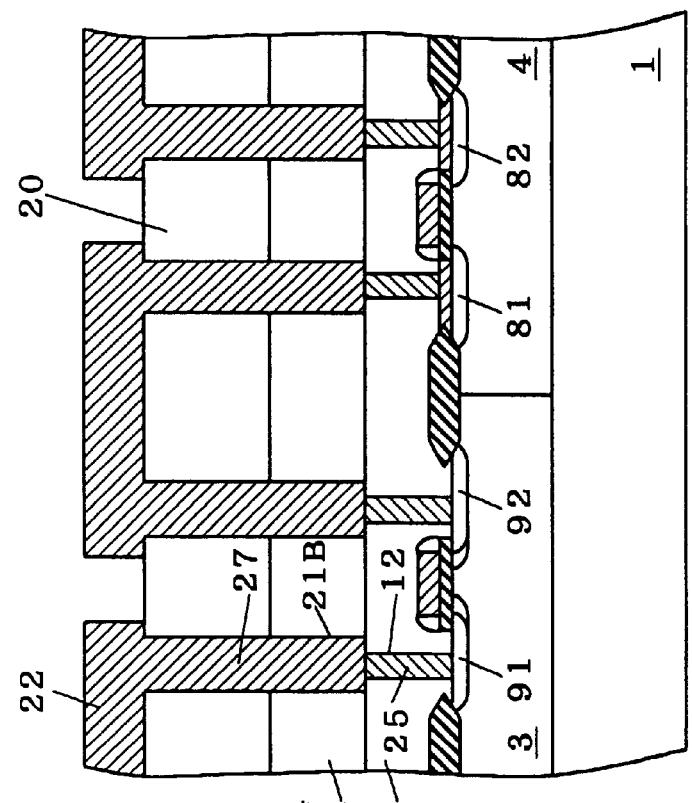
FIGS. 20A and 20B are sectional views for illustrating fabrication steps according to the embodiment 2 of the present invention.
Figure 20B:
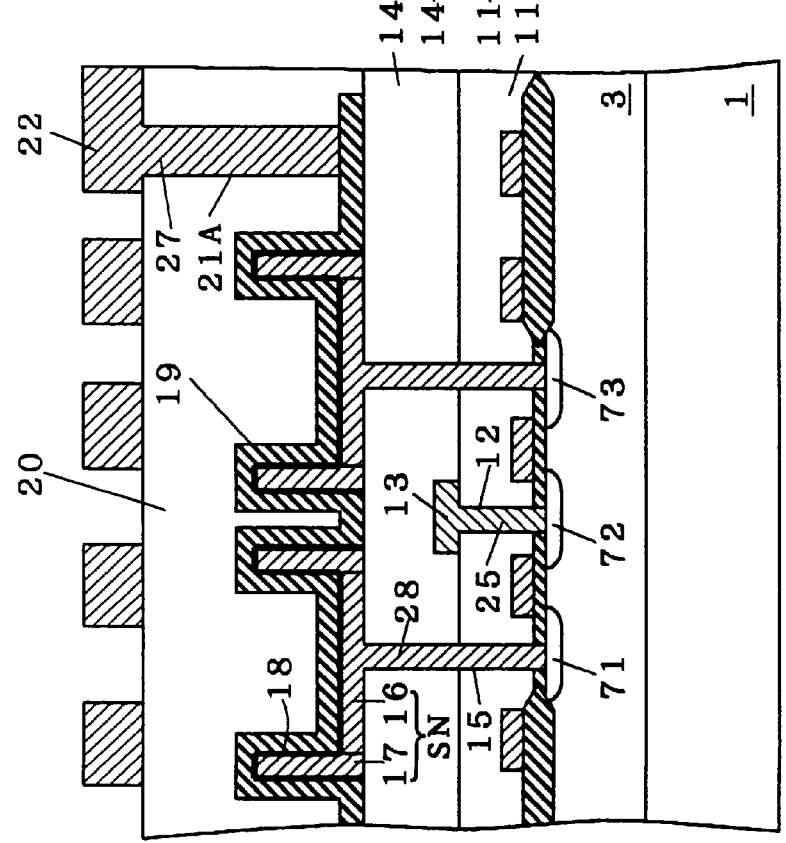

As an embodiment 2 according to the present invention, a method of fabricating a semiconductor device having cylindrical capacitor cells is successively described with reference to FIGS. 12A and 12B to 20A and 20B, and its characteristic functions/effects are described with reference to FIGS. 20A and 20B showing final steps.

Figure 12B:
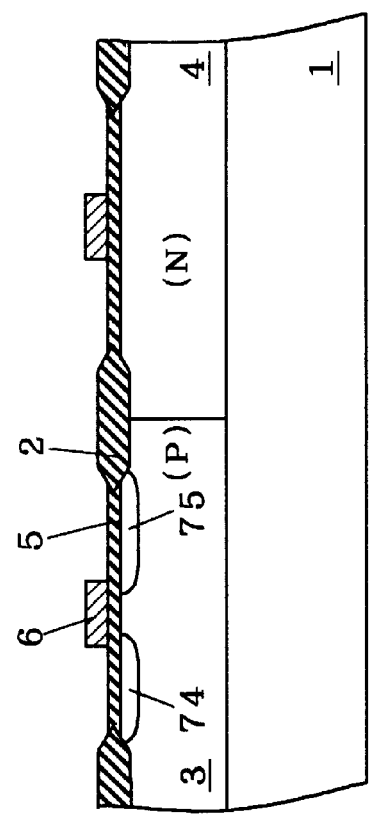
FIGS. 12A and 12B are sectional views for illustrating fabrication steps according to an embodiment 2 of the present invention.
Figure 12A:
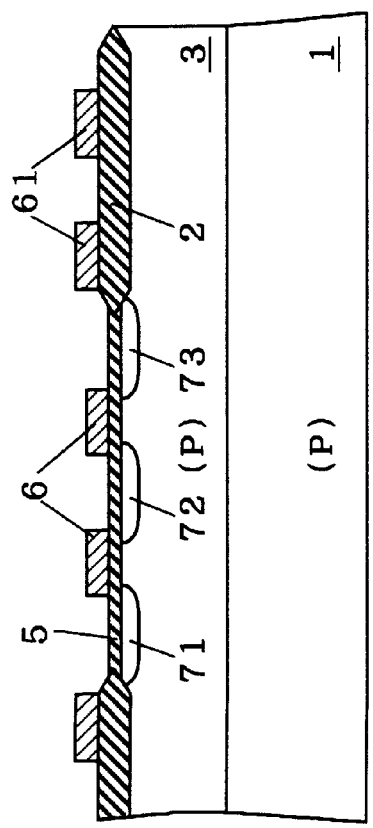

FIG. 12A is a partial sectional view showing a memory cell part of a DRAM, and FIG. 12B is a partial sectional view showing a peripheral circuit part comprising a sense amplifier, a decoder and the like which is formed around the memory cell part of the DRAM.

Steps shown in FIGS. 12A and 12B for forming field oxide films 2, P-type well regions 3, an N-type well region 4, gate electrodes 6, word lines 61 and N-type source/drain regions 71 to 75 are identical to those of the embodiment 1 of the present invention described with reference to FIGS. 1A and 1B, and structures identical to those of the embodiment 1 are denoted by the same reference numerals, to omit redundant description.

In steps shown in FIGS. 13A and 13B, an oxide film OX1 is formed along the overall surface and thereafter a resist film R1 is formed on regions excluding an upper portion of the N-type well region 4 of the peripheral circuit part, so that the oxide film OX1 is etched back through the resist film R1 serving as a mask thereby forming side wall oxide films 10 on both sides of the gate electrode 6 provided on the N-type well region 4 of the peripheral circuit part.

The gate electrode 6 and the side wall oxide films 10 provided on the N-type well region 4 of the peripheral circuit part and the resist film R1 are employed as masks to implant ions of a P-type impurity (B or $BF_2$) into the N-type well region 4 in a high dosage ($1\times10^{15}$ to $4\times10^{15}$ $cm^{-2}$), thereby forming $P^+$-type source/drain regions 81 and 82.

Figure 14B:
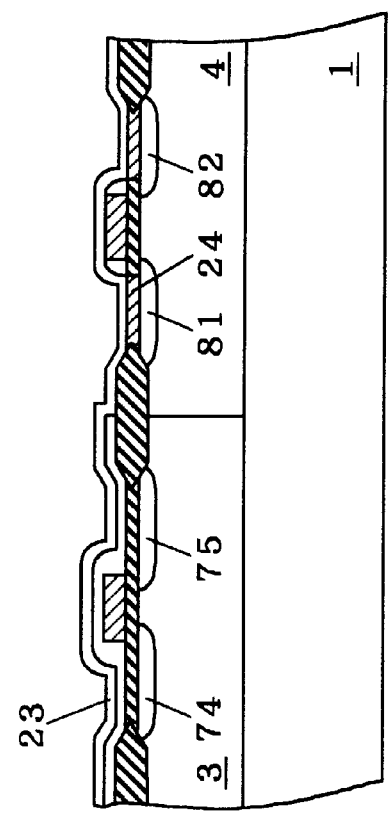
FIGS. 14A and 14B are sectional views for illustrating fabrication steps according to the embodiment 2 of the present invention.
Figure 14A:
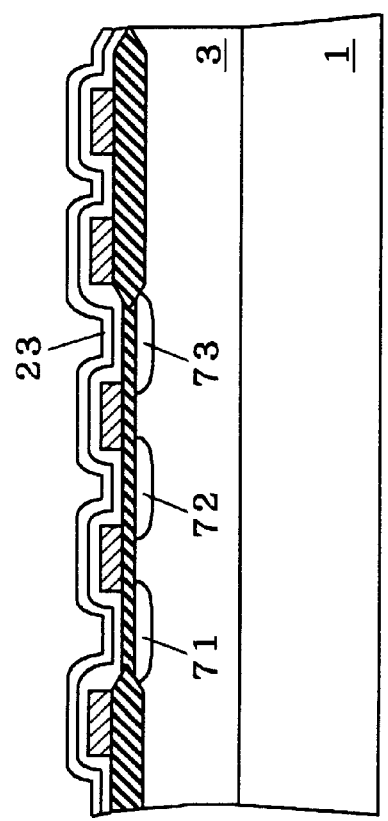

Then, the resist film R1 is removed, so that a high melting point metal film 23 is formed on the overall surface by W, Ti, Co, Ni or the like and selectively silicified by RTA or the like, in steps shown in FIGS. 14A and 14B.

At this time, portions of the peripheral circuit part exposing the $P^+$-type source/drain regions 81 and 82 are silicified so that high melting point metal silicide films 24 of $WSi_2$, $TiSi_2$, $CoSi_2$, $NiSi_2$ or the like, for example, are formed on these portions.

Figure 15B:
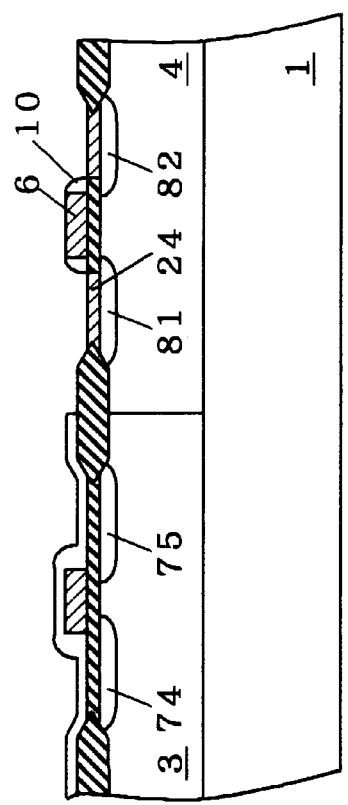
FIGS. 15A and 15B are sectional views for illustrating fabrication steps according to the embodiment 2 of the present invention.
Figure 15A:
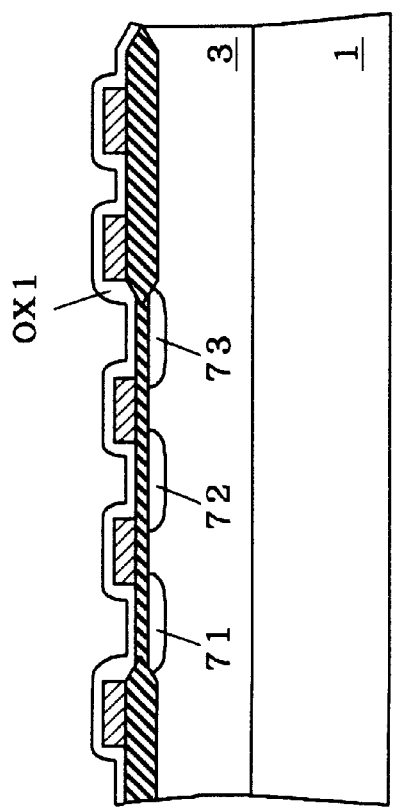

Then, the high melting point metal film 23 is removed to leave the high melting point metal silicide films 24 on the upper portions of the $P^+$-type source/drain regions 81 and 82 of the peripheral circuit part, in steps shown in FIGS. 15A and 15B.

Then, a resist film R2 is formed on regions excluding the upper portion of the P-type well region 3 of the peripheral circuit part and employed as a mask to etch back the oxide film OX1, thereby forming side wall oxide films 10 on both ends of the gate electrode 6 provided on the P-type well region 3 of the peripheral circuit part, in steps shown in FIGS. 16A and 16B.

Then, the gate electrode 6 and the side wall oxide films 10 provided on the P-type well region 3 of the peripheral circuit part and the resist film R2 are employed as masks for implanting N-type impurity ions into the N-type source/drain regions 74 and 75 in a high dosage ($1\times10^{15}$ to $4\times10^{15}$ $cm^{-2}$), thereby forming $N^+$-type source/drain regions 91 and 92.

Figure 17A:
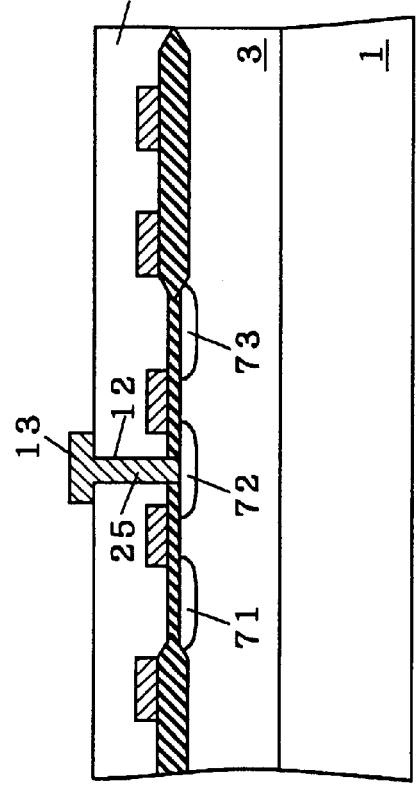
FIGS. 17A and 17B are sectional views for illustrating fabrication steps according to the embodiment 2 of the present invention.
Figure 17B:
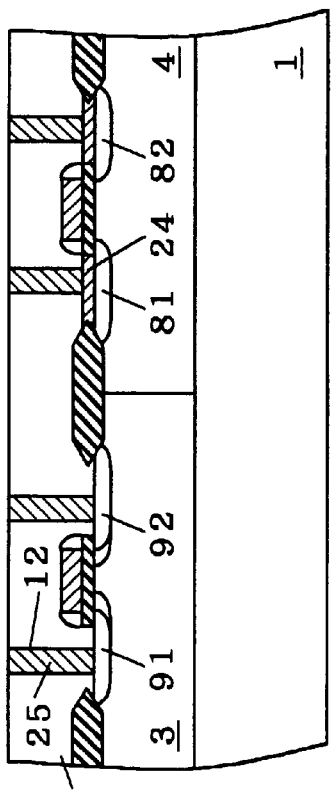

Then, the resist film R2 is removed, and thereafter an oxide film is formed along the overall surface and flattened thereby forming an interlayer insulating film 11, in steps shown in FIGS. 17A and 17B.

Then, bit line contact holes 12 passing through the interlayer insulating film 11 are formed to reach the N-type source/drain region 72 in the memory cell part and to reach the high melting point metal silicide films 24 on the upper portions of the $N^+$-type source/drain regions 91 and 92 and the $P^+$-type source/drain regions 81 and 82 in the peripheral circuit part.

Following formation of a bit line forming conductor layer along the overall surface of the interlayer insulating film 11, bit line forming conductor layers such as $N^+$ polysilicon layers into which an N-type impurity is introduced in high concentration, for example, are buried in the bit line contact holes 12.

Through steps of photolithography and etching, the bit line forming conductor layers are removed to form a bit line 13 on at least the memory cell part and while leaving buried layers 25 in the bit line contact holes 12 in the peripheral circuit part.

Figures 18A, 18B:
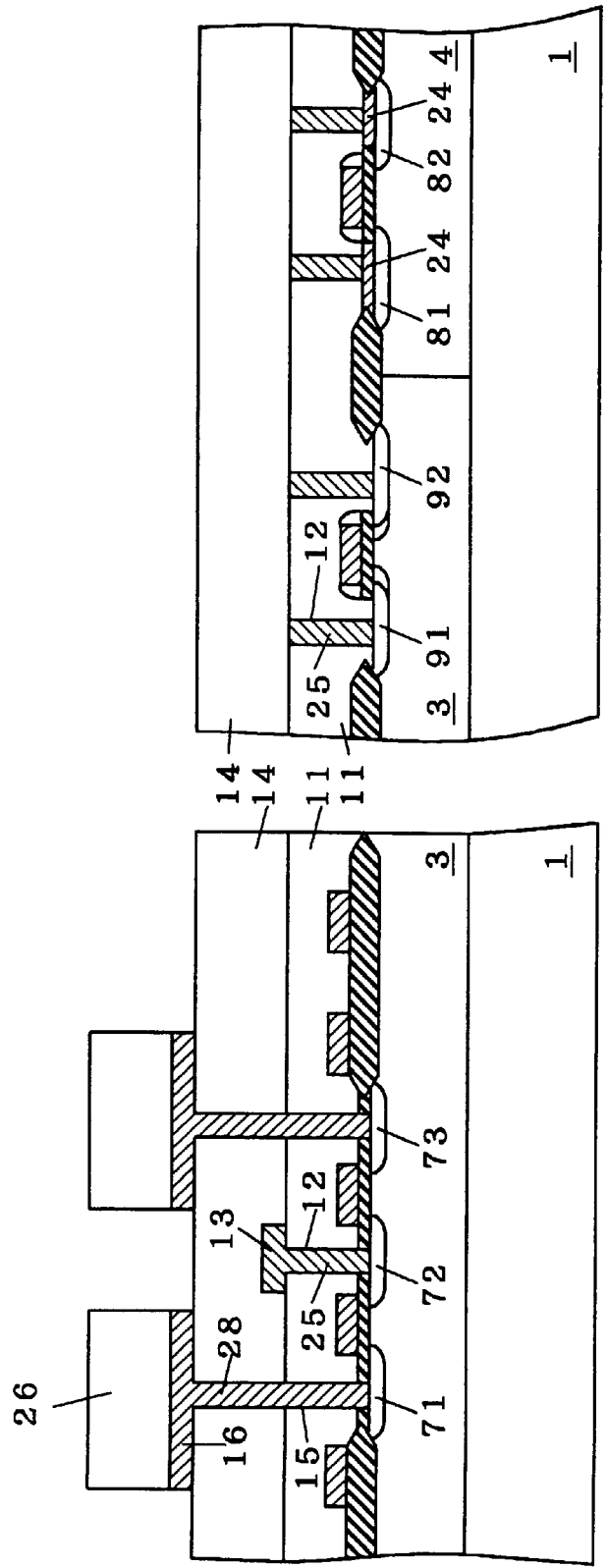
FIGS. 18A and 18B are sectional views for illustrating fabrication steps according to the embodiment 2 of the present invention.

Referring to FIGS. 18A and 18B, steps of forming an interlayer insulating film 14, storage node contact holes 15 and bottom surface films 16 forming bottom portions of storage nodes SN and cylindrical capacitor forming insulating films 26 are identical to the steps described in the embodiment 1 of the present invention with reference to FIGS. 7A and 7B, and structures identical to those of the embodiment 1 are denoted by the same reference numerals, to omit redundant description.

Referring to FIGS. 19A and 19B, steps of forming side surface films 17 forming side wall portions of the storage nodes SN, capacitor gate insulating films 18 and cell plate electrodes 19 are identical to the steps described in the embodiment 1 of the present invention with reference to FIGS. 8A, 8B, 9A and 9B, and structures identical to those of the embodiment 1 are denoted by the same reference numerals, to omit redundant description.

Referring to FIGS. 20A and 20B, steps of forming an interlayer insulating film 20, aluminum wire contact holes 21A and 21B, buried layers 27 in the aluminum wire contact holes 21A and 21B and aluminum wires 22 are identical to the steps described in the embodiment 1 of the present invention with reference to FIGS. 10A and 10B, and structures identical to those of the embodiment 1 are denoted by the same reference numerals, to omit redundant description.

<B-2. Characteristic Functions/Effects>

According to the embodiment 2 of the present invention, as hereinabove described, the high melting point metal silicide films 24 are formed only on the upper portions of the $P^+$-type source/drain regions 81 and 82 of the peripheral circuit part, while no high melting metal silicide films 24 are formed on the upper portions of the $N^+$-type source/drain regions 74 and 75.

When the bit line forming conductor layers buried in the bit line contact holes 21 are formed by $N^+$ polysilicon layers into which an N-type impurity is introduced in high concentration, the interfaces between the $P^+$-type source/drain regions 81 and 82 and the $N^+$ polysilicon layers disadvantageously form P-N junctions and no current can be fed if the former and the latter are brought into contact with each other, while energization is enabled due to interposition of the high melting point metal silicide films 24.

On the other hand, interposition of the high melting point metal silicide films 24 results in such a problem that leakage currents in the junctions are increased, and hence no high melting point metal silicide films 24 are formed on portions allowing no leakage at the junctions or those requiring no interposition of high melting point metal silicide films 24 such as the connected portions between the $N^+$-type source/drain regions 74 and 75 and the $N^+$ polysilicon layers, for example, whereby increase of leakage currents can be reduced.

<C. Embodiment 3>

<C-1. Fabrication Steps>

As an embodiment 3 according to the present invention, a method of fabricating a semiconductor device having cylindrical capacitor cells is successively described with reference to FIGS. 21A and 21B to 25A and 25B, and its characteristic functions/effects are described with reference to FIGS. 25A and 25B showing final steps.

Figure 21A:
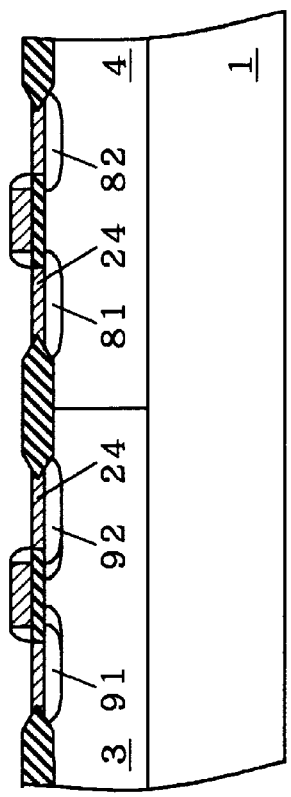
FIGS. 21A and 21B are sectional views for illustrating fabrication steps according to an embodiment 3 of the present invention.
Figure 21B:
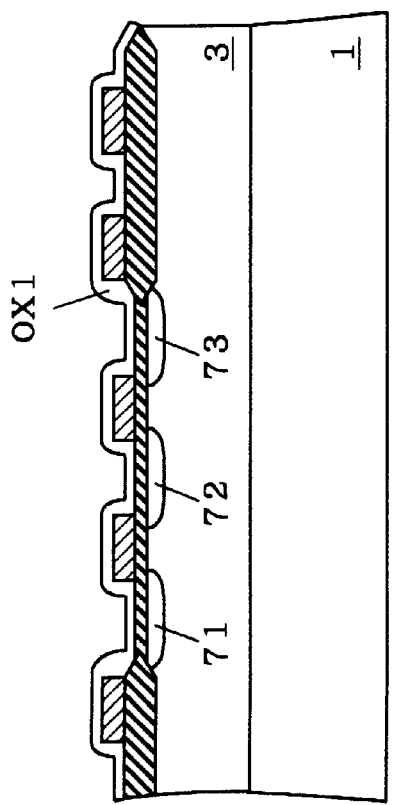

FIG. 21A is a partial sectional view showing a memory cell part of a DRAM, and FIG. 21B is a partial sectional view showing a peripheral circuit part comprising a sense amplifier, a decoder and the like which is formed around the memory cell part of the DRAM.

Steps up to those shown in FIGS. 21A and 21B are identical to those described in the embodiment 1 of the present invention with reference to FIGS. 1A and 1B to 4A and 4B, and hence redundant illustration and description are omitted.

In steps shown in FIGS. 21A and 21B, a high melting point metal film 23 is removed to leave high melting point metal silicide films 24 on upper portions of N+-type source/drain regions 91 and 92 and P+-type source/drain regions 81 and 82 of the peripheral circuit part.

Then, an oxide film is formed along the overall surface and flattened, thereby forming an interlayer insulating film 11 in steps shown in FIGS. 22A and 22B.

Then, a bit line contact hole 12 passing through the interlayer insulating film 11 is formed to reach the N-type source/drain region 72 in the memory cell part.

Following formation of a bit line forming conductor layer along the overall surface of the interlayer insulating film 11, a bit line forming conductor layer is buried in the bit line contact hole 12.

Through steps of photolithography and etching, a bit line 13 is formed on at least the memory cell part.

Figure 23A:
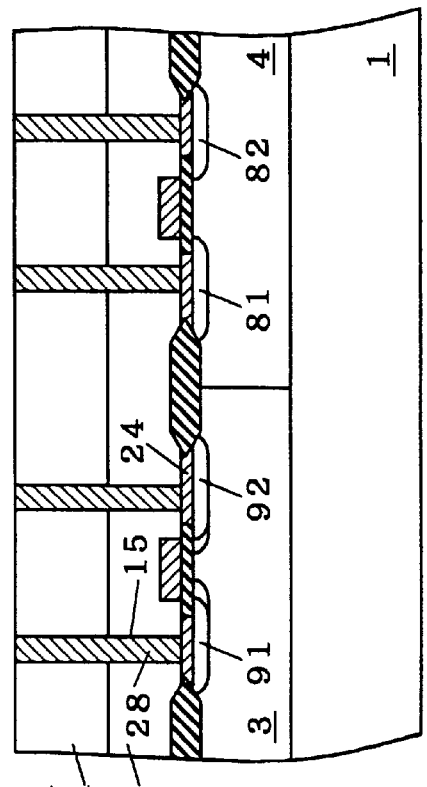
FIGS. 23A and 23B are sectional views for illustrating fabrication steps according to the embodiment 3 of the present invention.
Figure 23B:
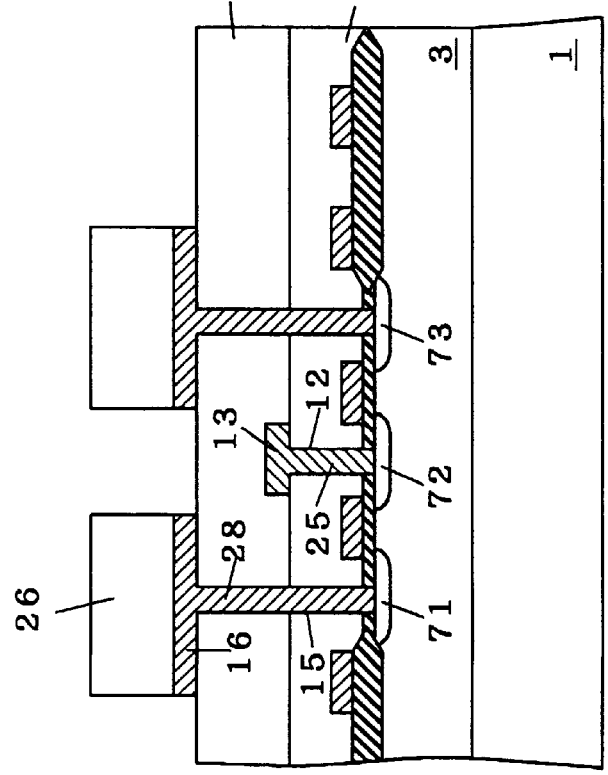

Then, an oxide film is formed along the overall surface of the interlayer insulating film 11 and flattened thereby forming an interlayer insulating film 14, in steps shown in FIGS. 23A and 23B.

Then, storage node contact holes 15 (fifth storage node contact holes) passing through the interlayer insulating films 11 and 14 are formed to reach the N-type source/drain regions 71 and 73 in the memory cell part and to reach the high melting point metal silicide films 24 on the upper portions of the N+-type source/drain regions 91 and 92 and the P+-type source/drain regions 81 and 82 in the peripheral circuit part.

Following formation of a storage node forming conductor layer along the overall surface of the interlayer insulating film 14 by an N+ polysilicon layer into which an N-type impurity is introduced in high concentration, for example, storage node forming conductor layers are buried in the storage node contact holes 15.

Then, an insulating film is thickly formed along the overall surface, and the storage node forming conductor layer and the thick insulating film are removed through steps of photolithography and etching to leave only bottom surface films 16 forming bottom portions of storage nodes SN and portions of the insulating film located on the bottom surface films 16. In the peripheral circuit part, the storage node forming conductor layers are so removed that the same are left in the storage node contact holes 15 as buried layers 28 (fifth storage node buried layers).

Figure 24B:
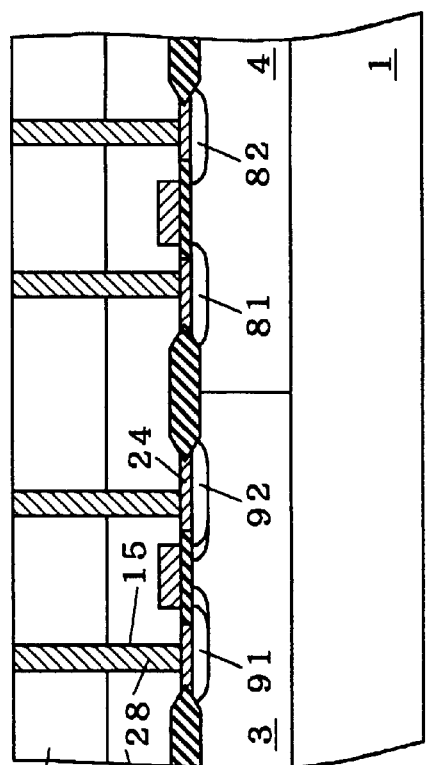
FIGS. 24A and 24B are sectional views for illustrating fabrication steps according to the embodiment 3 of the present invention.
Figure 24A:
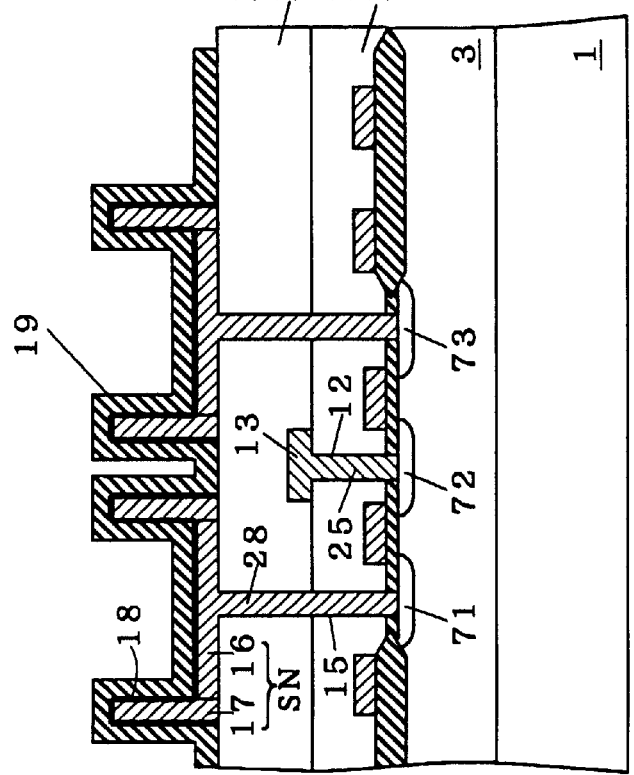

Referring to FIGS. 24A and 24B, steps of forming side surface films 17 forming side wall portions of the storage nodes SN, capacitor gate insulating films 18 and cell plate electrodes 19 are identical to the steps described in the embodiment 1 of the present invention with reference to FIGS. 8A, 8B, 9A and 9B, and structures identical to those of the embodiment 1 are denoted by the same reference numerals, to omit redundant description.

Then, an oxide film is formed along the overall surface and flattened thereby forming an interlayer insulating film 20, in steps shown in FIGS. 25A and 25B.

Then, an aluminum wire contact hole 21A is formed in the memory cell part to reach the cell plate electrode 19, while aluminum wire contact holes 21B passing through the interlayer insulating film 20 are formed in the peripheral circuit part to reach the buried layers 28 in the storage node contact holes 15.

Then, following formation of an aluminum wire forming conductor layer along the overall surface of the interlayer insulating film 20, aluminum wire forming conductor layers are buried in the aluminum wire contact holes 21A and 21B. At this time, buried layers 27 are formed in the aluminum wire contact holes 21A and 21B. While the aluminum wire forming conductor layers are buried in the aluminum wire contact holes 21A and 21B according to this embodiment, the same are not restricted to aluminum but may be prepared from conductor layers of a metal or the like.

Aluminum wires 22 are formed on the interlayer insulating film 20 on the memory cell part and the peripheral circuit part through steps of photolithography and etching, whereby a semiconductor device having cylindrical capacitor cells can be obtained.

The peripheral circuit part is also provided with TG wires (not shown in FIGS. 21B to 25B) or the like formed in the same fabrication process as word lines 61 (i.e., the gate electrodes 6), and forming positions thereof are in layers substantially identical to the gate electrodes 6. Therefore, the TG wires may be electrically connected with the aluminum wires 22 through the storage node contact holes 15 and the aluminum wire contact holes 21B.

Namely, bit line contact holes (substantially identical to the storage node contact holes 15) passing through the interlayer insulating films 11 and 14 and reaching the TG wires are simultaneously formed in formation of the storage node contact holes 15 in the step shown in FIG. 23B, so that storage node forming conductor layers are simultaneously buried in the bit line contact holes reaching the TG wires when the storage node forming conductor layers are buried in the storage node contact holes 15.

In the step shown in FIG. 25B, aluminum wire contact holes 21B are formed to reach the conductor layers in the bit line contact holes passing through the interlayer insulating film 20 and reaching the TG wires.

<C-2. Characteristic Functions/Effects>

According to the embodiment 3 of the present invention, as hereinabove described, the aluminum wires 22 provided on the interlayer insulating film 20 of the peripheral circuit part are electrically connected with semiconductor diffusion regions, i.e., the N+-type source/drain regions 91 and 92 and the P+-type source/drain regions 81 and 82 by the storage node contact holes 15 which are formed through the interlayer insulating films 11 and 14 to have the buried layers 28 therein and the aluminum wire contact holes 21B which are formed through the interlayer insulating film 20 to have the buried layers 27 therein, as shown in FIG. 25B. Therefore, the aluminum wire contact holes 21B in the peripheral circuit part are prevented from being remarkably deeper than the aluminum wire contact hole 21A in the memory cell part, whereby it is possible to prevent such a situation that the cell plate electrodes 19 are overetched due to difference between these depths.

Further, the aspect ratios of the aluminum wire contact holes 21B in the peripheral circuit part can be reduced, the conductor layers can be stably buried in process, and the aluminum wires can be electrically stably connected with the semiconductor diffusion regions.

<D. Embodiment 4>
<D-1. Fabrication Steps>

As an embodiment 4 according to the present invention, a method of fabricating a semiconductor device having cylindrical capacitor cells is successively described with reference to FIGS. 26A and 26B to 30A and 30B, and its characteristic functions/effects are described with reference to FIGS. 30A and 30B showing final steps.

Figure 26B:
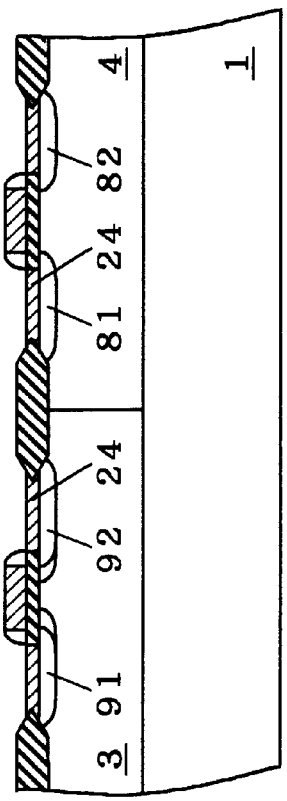
FIGS. 26A and 26B are sectional views for illustrating fabrication steps according to an embodiment 4 of the present invention.
Figure 26A:
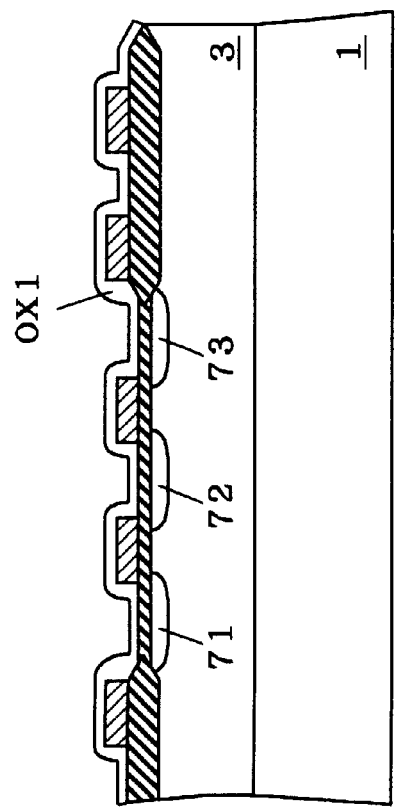

FIG. 26A is a partial sectional view showing a memory cell part of a DRAM, and FIG. 26B is a partial sectional view showing a peripheral circuit part comprising a sense amplifier, a decoder and the like which is formed around the memory cell part of the DRAM.

Steps up to those shown in FIGS. 26A and 26B are identical to those described in the embodiment 1 of the present invention with reference to FIGS. 1A and 1B to 4A and 4B, and hence redundant illustration and description are omitted.

In the steps shown in FIGS. 26A and 26B, a high melting point metal film 23 is removed to leave high melting point metal silicide films 24 on upper portions of $N^+$-type source/drain regions 91 and 92 and $P^+$-type source/drain regions 81 and 82 of the peripheral circuit part.

Figure 27A:
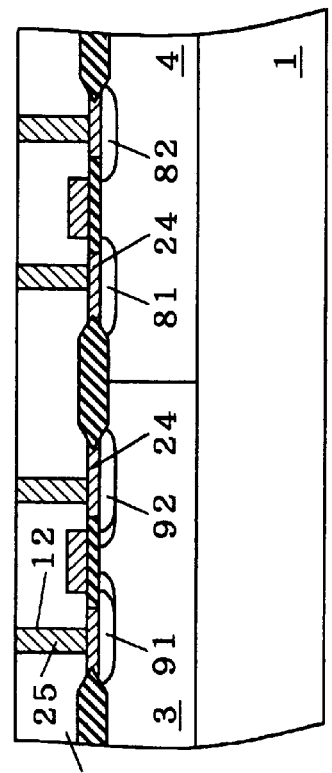
FIGS. 27A and 27B are sectional views for illustrating fabrication steps according to the embodiment 4 of the present invention.
Figure 27B:
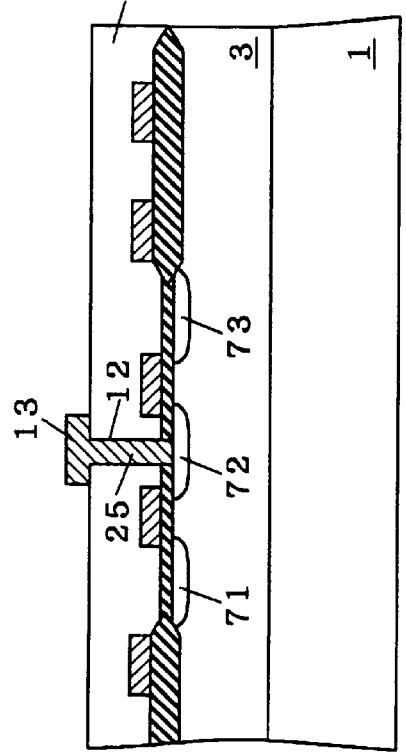

Then, an oxide film is formed along the overall surface and flattened, thereby forming an interlayer insulating film 11 in steps shown in FIGS. 27A and 27B.

Then, bit line contact holes 12 passing through the interlayer insulating film 11 are formed to reach the N-type source/drain region 72 in the memory cell part and to reach the high melting point metal silicide films 24 on the upper portions of the $N^+$-type source/drain regions 91 and 92 and the $P^+$-type source/drain regions 81 and 82 in the peripheral circuit part.

Then, following formation of a bit line forming conductor layer along the overall surface of the interlayer insulating film 11, bit line forming conductor layers are buried in the bit line contact holes 21.

Then, the bit line forming conductor layers are removed through steps of photolithography and etching to form a bit line 13 at least in the memory cell part while leaving buried layers 25 in the bit line contact holes 12 in the peripheral circuit part.

Then, an oxide film is formed along the overall surface of the interlayer insulating film 11 and flattened, thereby forming an interlayer insulating film 14 in steps shown in FIGS. 28A and 28B.

Then, storage node contact holes 15 passing through the interlayer insulating films 11 and 14 are formed to reach the N-type source/drain regions 71 and 73 in the memory cell part, while storage node contact holes 151 (second storage node contact holes) passing through the interlayer insulating film 14 are formed to reach the buried layers 25 in the bit line contact holes 12 in the peripheral circuit part.

Then, following formation of a storage node forming conductor layer by an $N^+$ polysilicon layer into which an N-type impurity is introduced in high concentration, for example, along the overall surface of the interlayer insulating film 14, storage node forming conductor layers are buried in the storage node contact holes 15 and 151.

Then, an insulating film is thickly formed along the overall surface, and the storage node forming conductor layer and the thick insulating film are removed through steps of photolithography and etching to leave only bottom surface films 16 forming bottom portions of storage nodes SN and portions of the insulating film located on the bottom surface films 16. In the peripheral circuit part, the storage node forming conductor layers are left as buried layers 28 (fifth storage node buried layers) in the storage node contact holes 151.

Referring to FIGS. 29A and 29B, steps of forming side surface films 17 forming side wall portions of the storage nodes SN, capacitor gate insulating films 18 and cell plate electrodes 19 are identical to the steps described in the embodiment 1 of the present invention with reference to FIGS. 8A, 8B, 9A and 9B, and structures identical to those of the embodiment 1 are denoted by the same reference numerals, to omit redundant description.

Referring to FIGS. 30A and 30B, steps of forming an interlayer insulating film 20 and aluminum wire contact holes 21A and 21B and a step of obtaining a semiconductor device having cylindrical capacitor cells by forming aluminum wires 22 on the interlayer insulating film 20 are identical to the steps described in the embodiment 3 of the present invention with reference to FIGS. 25A and 25B, and structures identical to those of the embodiment 3 are denoted by the same reference numerals, to omit redundant description.

The peripheral circuit part is also provided with TG wires (not shown in FIGS. 26B to 30B) or the like which are formed in the same fabrication process as word lines 61 (i.e., the gate electrodes 6), and forming positions thereof are in layers substantially identical to the gate electrodes 6. Therefore, the TG wires may be electrically connected with the aluminum wires 22 through the bit line contact holes 12, the storage node contact holes 151 and the aluminum wire contact holes 21B.

Namely, bit line contact holes (substantially identical to the bit line contact holes 12) passing through the interlayer insulating film 11 and reaching the TG wires are simultaneously formed in formation of the bit line contact holes 12 in the step shown in FIG. 27B, so that bit line forming conductor layers are simultaneously buried in the bit line contact holes reaching the TG wires when the bit line forming conductor layers are buried in the bit line contact holes 12.

Then, the storage node contact holes 151 passing through the interlayer insulating film 14 and reaching the conductor layers in the bit line contact holes reaching the TG wires are formed in the step shown in FIG. 28B.

Further, the aluminum wire contact holes 21B passing through the interlayer insulating film 20 and reaching the conductor layers in the storage node contact holes 151 are formed in the step shown in FIG. 30B.

The peripheral circuit part is also provided with BL wires (not shown in FIGS. 26B to 30B) or the like which are formed in the same fabrication process as the bit line 13, and forming positions thereof are in a layer substantially identical to the bit line 13. Therefore, the BL wires may be electrically connected with the aluminum wires 22 through the storage node contact holes 151 and the aluminum wire contact holes 21B.

<D-2. Characteristic Functions/Effects>

According to the embodiment 4 of the present invention, as hereinabove described, the aluminum wires 22 provided on the interlayer insulating film 20 of the peripheral circuit part are electrically connected with semiconductor diffusion regions, i.e., the $N^+$-type source/drain regions 91 and 92 and the $P^+$-type source/drain regions 81 and 82 by the bit line contact holes 12 which are formed through the interlayer insulating film 11 to have the buried layers 25 therein, the storage node contact holes 151 which are formed through the interlayer insulating film 14 to have the buried layers 28 therein and the aluminum wire contact holes 21B which are formed through the interlayer insulating film 20 to have the buried layers 27 therein. Therefore, the aluminum wire contact holes 21B in the peripheral circuit part are prevented from being remarkably deeper than the aluminum wire contact hole 21A in the memory cell part, whereby it is possible to prevent such a situation that the cell plate electrodes 19 are overetched due to difference between these depths.

This effect also applies in case of connecting TG wires with the aluminum wires 22 through the bit line contact holes 12, the storage node contact holes 151 and the aluminum wire contact holes 21B.

Further, the aspect ratios of the aluminum wire contact holes 21B in the peripheral circuit part can be reduced, the conductor layers can be stably buried in process, and the aluminum wires can be electrically stably connected with the semiconductor diffusion regions.

<E. Embodiment 5>

<E-1. Fabrication Steps>

As an embodiment 5 according to the present invention, a method of fabricating a semiconductor device having cylindrical capacitor cells is successively described with reference to FIGS. 31A and 31B to 35A and 35B, and its characteristic functions/effects are described with reference to FIGS. 35A and 35B showing final steps.

FIG. 31A is a partial sectional view showing a memory cell part of a DRAM, and FIG. 31B is a partial sectional view showing a peripheral circuit part comprising a sense amplifier, a decoder and the like which is formed around the memory cell part of the DRAM.

Steps up to those shown in FIGS. 31A and 31B are identical to those described in the embodiment 1 of the present invention with reference to FIGS. 1A and 1B to 4A and 4B, and hence redundant illustration and description are omitted.

In the steps shown in FIGS. 31A and 31B, a high melting point metal film 23 is removed to leave high melting point metal silicide films 24 on upper portions of N$^+$-type source/drain regions 91 and 92 and P$^+$-type source/drain regions 81 and 82 of the peripheral circuit part.

Figure 32A:
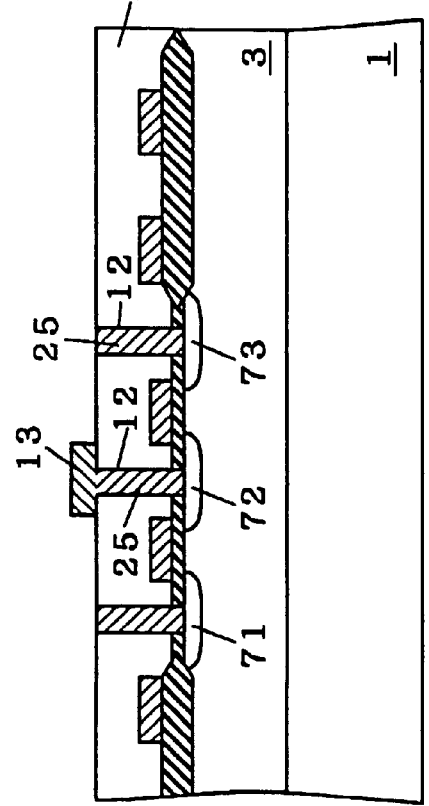
FIGS. 32A and 32B are sectional views for illustrating fabrication steps according to the embodiment 5 of the present invention.
Figure 32B:
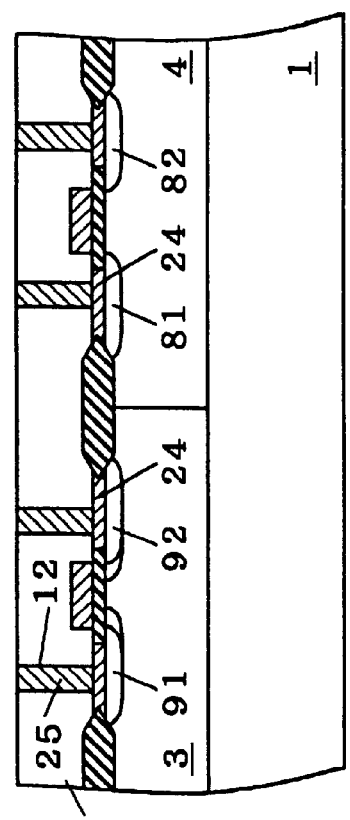

Then, an oxide film is formed along the overall surface and flattened, thereby forming an interlayer insulating film 11 in steps shown in FIGS. 32A and 32B.

Then, bit line contact holes 12 passing through the interlayer insulating film 11 are formed to reach N-type source/drain regions 71 to 73 in the memory cell part and to reach the high melting point metal silicide films 24 on the upper portions of the N$^+$-type source/drain regions 91 and 92 and the P$^+$-type source/drain regions 81 and 82 in the peripheral circuit part.

Then, following formation of a bit line forming conductor layer along the overall surface of the interlayer insulating film 11, bit line forming conductor layers are buried in the bit line contact holes 12.

Through steps of photolithography and etching, a bit line 13 is formed on a contact hole 12 (first bit line contact hole) reaching the N-type source/drain region 72 and buried layers 25 (third bit line buried layers) are formed in contact holes 12 (third bit line contact holes) reaching the N-type source/drain regions 71 and 73 in the memory cell part, while the bit line forming conductor layers are removed to leave buried layers 25 (second bit line buried layers) in the bit line contact holes 12 (second bit line contact holes) in the peripheral circuit part.

Then, an oxide film is formed along the overall surface of the interlayer insulating film 11 and flattened, for forming an interlayer insulating film 14 in steps shown in FIGS. 33A and 33B.

Then, storage node contact holes 152 (third storage node contact holes) passing through the interlayer insulating film 14 are formed to reach the buried layers 25 in the contact holes 12 reaching the N-type source/drain regions 71 and 73 in the memory cell part, while storage node contact holes 152 (fourth storage node contact holes) passing through the interlayer insulating film 14 are formed to reach the buried layers 25 in the bit line contact holes 12 in the peripheral circuit part.

Then, following formation of a storage node forming conductor layer along the overall surface of the interlayer insulating film 14, storage node forming conductor layers are buried in the storage node contact holes 152 of the memory cell part and the peripheral circuit part.

Then, an insulating film is thickly formed along the overall surface, and the storage node forming conductor layer and the thick insulating film are removed through steps of photolithography and etching to leave only bottom surface films 16 forming bottom portions of storage nodes SN and portions of the insulating film located on the bottom surface films 16. In the memory cell part and the peripheral circuit part, the storage node forming conductor layers are left as buried layers 28 (third and fourth storage node buried layers) in the storage node contact holes 152.

Figure 34B:
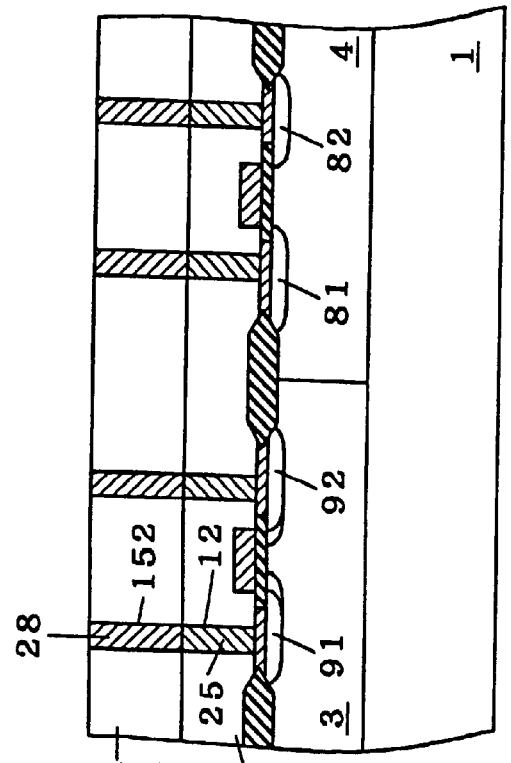
FIGS. 34A and 34B are sectional views for illustrating fabrication steps according to the embodiment 5 of the present invention.
Figure 34A:
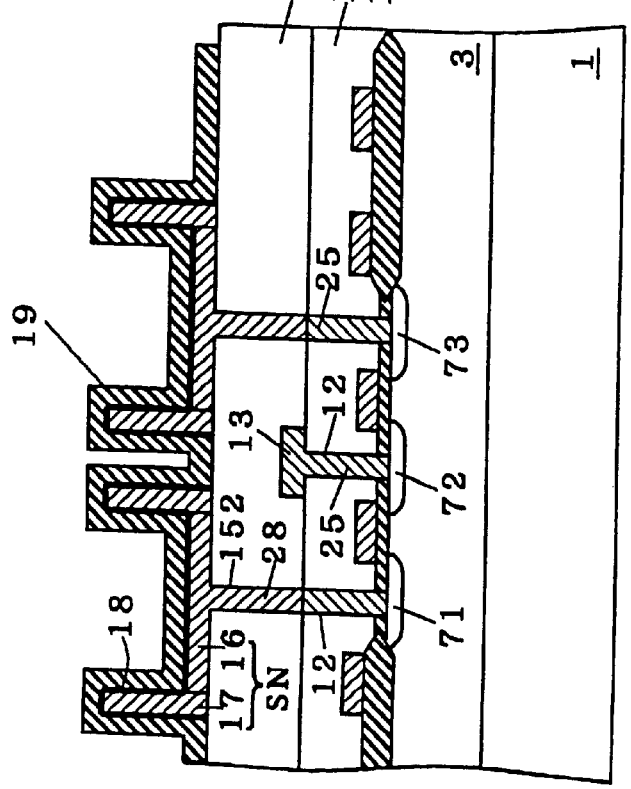

Referring to FIGS. 34A and 34B, steps of forming side surface films 17 forming side wall portions of the storage nodes SN, capacitor gate insulating films 18 and cell plate electrodes 19 are identical to the steps described in the embodiment 1 of the present invention with reference to FIGS. 8A, 8B, 9A and 9B, and structures identical to those of the embodiment 1 are denoted by the same reference numerals, to omit redundant description.

Referring to FIGS. 35A and 35B, steps of forming an interlayer insulating film 20 and aluminum wire contact holes 21A and 21B and a step of obtaining a semiconductor device having cylindrical capacitor cells by forming aluminum wires 22 on the interlayer insulating film 20 are identical to the steps described in the embodiment 3 of the present invention with reference to FIGS. 25A and 25B, and structures identical to those of the embodiment 3 are denoted by the same reference numerals, to omit redundant description.

<E-2. Characteristic Functions/Effects>

According to the embodiment 5 of the present invention, as hereinabove described, the storage nodes SN provided on the interlayer insulating film 14 are electrically connected with semiconductor diffusion regions, i.e., the N-type source/drain regions 71 and 73 by the bit line contact holes 12 which are formed through the interlayer insulating film 11 to have the buried layers 25 therein and the storage node contact holes 152 which are formed through the interlayer insulating film 14 to have the buried layers 28 therein in the memory cell part, as shown in FIG. 35B.

Further, the aluminum wires 22 provided on the interlayer insulating film 20 of the peripheral circuit part are electrically connected with semiconductor diffusion regions, i.e., the N$^+$-type source/drain regions 91 and 92 and the P$^+$-type source/drain regions 81 and 82 by the bit line contact holes 12 which are formed through the interlayer insulating film 11 to have the buried layers 25 therein, the storage node contact holes 152 which are formed through the interlayer insulating film 14 to have the buried layers 28 therein and the aluminum wire contact holes 21B which are formed through the interlayer insulating film 20 to have the buried layers 27 therein. Therefore, the storage node contact holes 152 in the memory cell part and those in the peripheral circuit part are of the same depths, whereby it is possible to prevent such a situation that the buried layers 25 in the bit line contact holes 12 are overetched due to difference between these depths.

Further, the aluminum wire contact holes 21B in the peripheral circuit part are prevented from being remarkably deeper than the aluminum wire contact hole 21A in the memory cell part, whereby it is possible to prevent such a situation that the cell plate electrodes 19 are overetched due to difference between these depths.

In addition, the aspect ratios of the aluminum wire contact holes 21B in the peripheral circuit part can be reduced, the conductor layers can be stably buried in process, and the aluminum wires can be electrically stably connected with the semiconductor diffusion regions.

<F. Modifications of Embodiments>

In the aforementioned embodiments 1 to 5 according to the present invention, the aluminum wires in the aluminum wire contact holes and the buried layers in the bit line contact holes, the aluminum wires in the aluminum wire contact holes and the buried layers in the storage node contact holes, and the buried layers in the storage node contact holes and the buried layers in the bit line contact holes are connected by the so-called borderless structure of directly connecting the buried layers with each other, while connection thereof is not restricted to the borderless structure.

Alternatively, a pad structure of forming pad layers on upper portions of buried layers positioned on lower layers for connecting the pad layers with buried layers positioned on upper layers may be employed.

The pad structure is now described with reference to FIGS. 36 to 38.

Figure 36:
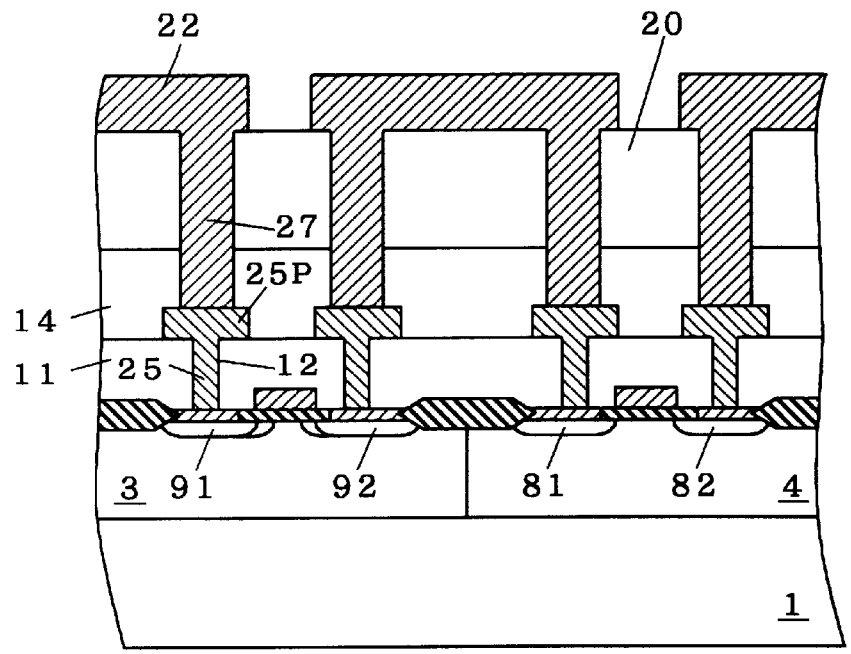
FIG. 36 is a sectional view for illustrating the structure of a modification of the embodiment 1 according to the present invention.

FIG. 36 corresponds to FIG. 10B showing the final step of the embodiment 1. Structures identical to those in FIG. 10B are denoted by the same reference numerals, to omit redundant description.

Referring to FIG. 36, buried layers 25 are provided in bit line contact holes 12 which are formed through an interlayer insulating film 11, while pad layers 25P extending along the interlayer insulating film 11 are formed on upper portions of the buried layers 25 so that buried layers 27 in aluminum wire contact holes 21B are connected to the pad layers 25P. The buried layers 25 and the pad layers 25P are integrally formed with each other.

The pad layers 25P are formed to be wider than the buried layers 27, whereby the buried layers 27 can be prevented from being connected to positions completely displaced from the pad layers 25P even if relative positions of the bit line contact holes 12 and the aluminum wire contact holes 21 are slightly displaced.

Figure 37:
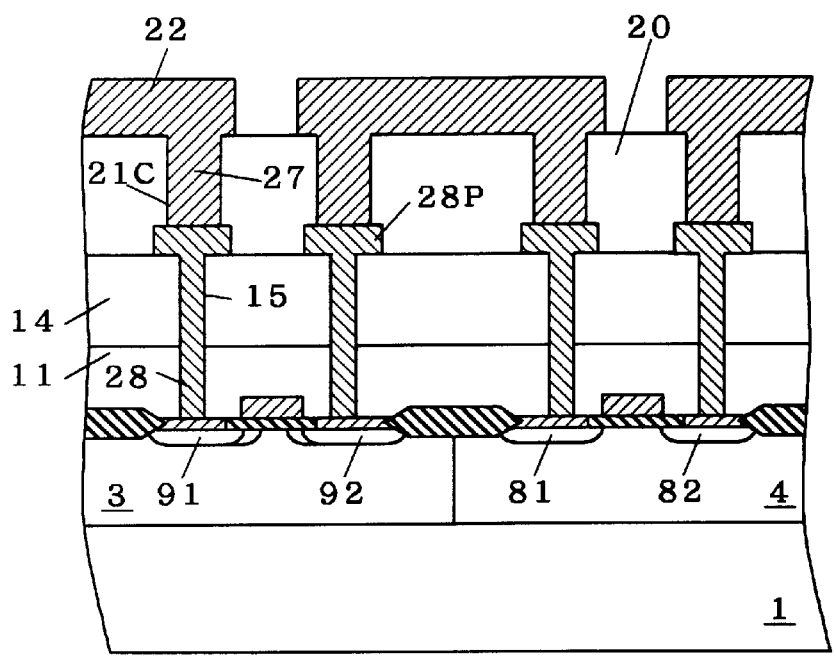
FIG. 37 is a sectional view for illustrating the structure of a modification of the embodiment 3 according to the present invention.

FIG. 37 corresponds to FIG. 25B showing the final step of the embodiment 3. Structures identical to those in FIG. 25B are denoted by the same reference numerals, to omit redundant description.

Referring to FIG. 37, buried layers 28 are provided in storage node contact holes 15 which are formed through interlayer insulating films 11 and 14, while pad layers 28P extending along the interlayer insulating film 14 are formed on upper portions of the buried layers 28 so that buried layers 27 in aluminum wire contact holes 21 are connected to the pad layers 28P. The buried layers 28 and the pad layers 28P are integrally formed with each other.

The pad layers 28P are formed to be wider than the buried layers 27, whereby the buried layers 27 can be prevented from being connected to positions completely displaced from the pad layers 28P even if relative positions of the storage node contact holes 15 and the aluminum wire contact holes 21 are slightly displaced.

Figure 38:
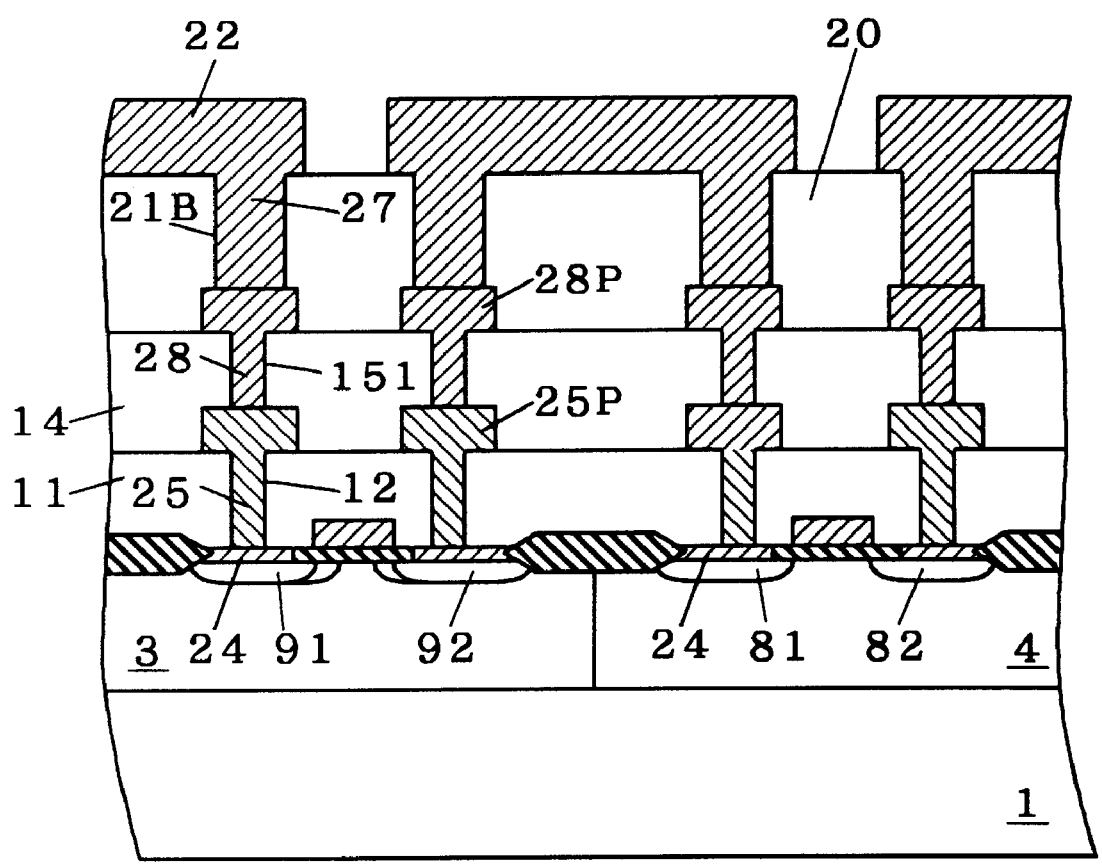
FIG. 38 is a sectional view for illustrating the structure of a modification of each of the embodiments 4 and 5 according to the present invention.
Figures 39A, 39B:
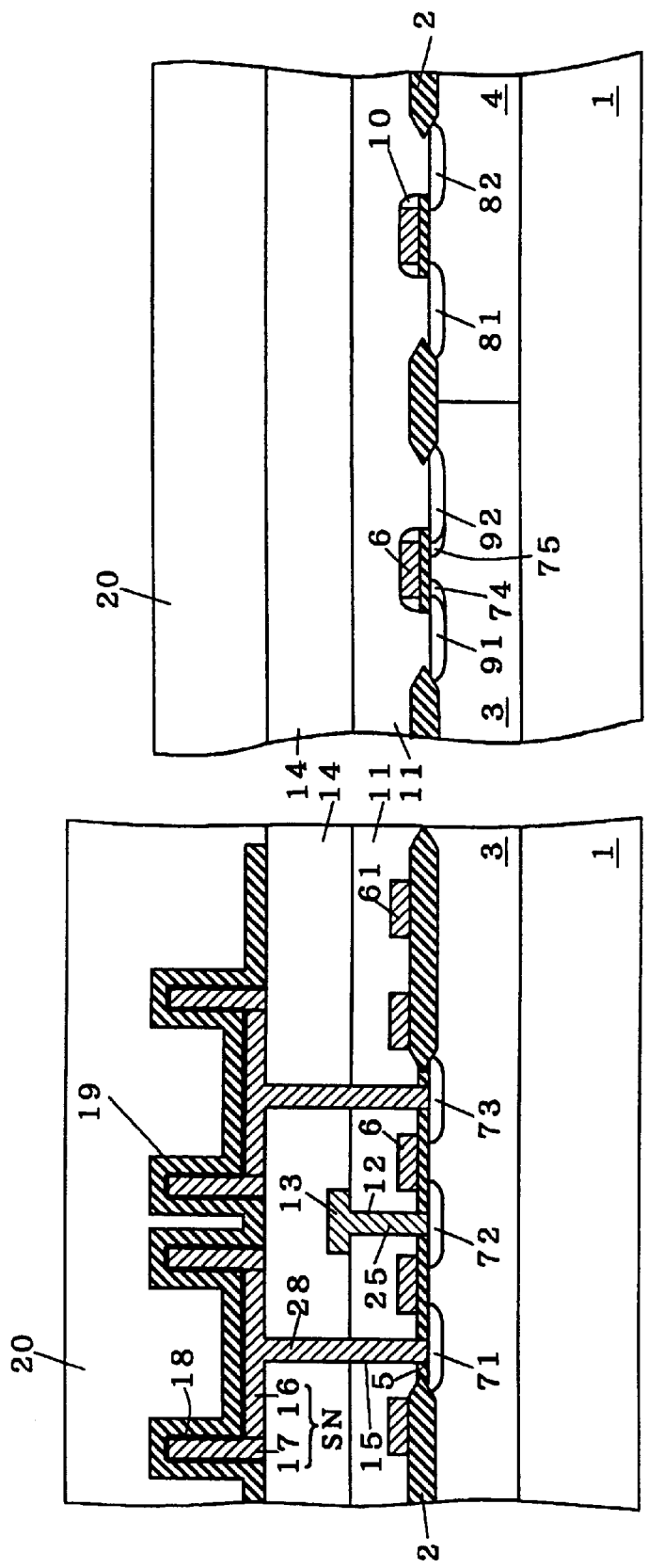
FIGS. 39A and 39B are sectional views for illustrating fabrication steps of a conventional semiconductor device.

FIG. 38 corresponds to FIG. 30B showing the final step of the embodiment 4. Structures identical to those in FIG. 30B are denoted by the same reference numerals, to omit redundant description.

Referring to FIG. 38, buried layers 25 are provided in bit line contact holes 12 which are formed through an interlayer insulating film 11, while pad layers 25P extending along the interlayer insulating film 11 are formed on upper portions of the buried layers 25 so that buried layers 28 in storage node contact holes 151 are connected to the pad layers 25P.

Further, the buried layers 28 are provided in the storage node contact holes 151 which are formed through an interlayer insulating film 14, while pad layers 28P extending along the interlayer insulating film 14 are formed on upper portions of the buried layers 28 so that buried layers 27 in aluminum wire contact holes 21 are connected to the pad layers 28P.

The pad layers 25P are formed to be wider than the buried layers 28, whereby the buried layers 28 can be prevented from being connected to positions completely displaced from the pad layers 25P even if relative positions of the bit line contact holes 12 and the storage node contact holes 151 are slightly displaced. Further, the pad layers 28P are formed to be wider than the buried layers 27, whereby the buried layers 27 can be prevented from being connected to positions completely displaced from the pad layers 28P even if relative positions of the storage node contact holes 151 and the aluminum wire contact holes 21 are slightly displaced.

While the buried layers 25 in the bit line contact holes 12, the storage nodes SN and the buried layers 28 in the storage node contact holes are formed by $N^+$ polysilicon layers into which an N-type impurity is introduced in high concentration in the aforementioned embodiments 1 to 5 according to the present invention, these may be formed by conductors such as metal layers or $P^+$ polysilicon layers into which a P-type impurity is introduced in high concentration.

While the invention has been shown and described in detail, the foregoing description is in all aspects illustrative and not restrictive. It is therefore understood that numerous modifications and variations can be devised without departing from the scope of the invention.

We claim:

1. A semiconductor device comprising a data holding part having a stacked capacitor as a capacitive element for holding data by storing charges in said stacked capacitor and a peripheral circuit part operating in association with said data holding part on a common semiconductor substrate, wherein said data holding part comprises,
    a first part of a first interlayer insulating film formed on said semiconductor substrate,
    a first bit line contact hole formed through said first part of said first interlayer insulating film to electrically connect a bit line formed on said first part of said first interlayer insulating film with said semiconductor substrate, said first bit line contact hole containing a first bit line buried layer of a same material as said bit line, a first part of a second interlayer insulating film formed on said first part of said first interlayer insulating film to cover said bit line, a storage node formed on said first part of said second interlayer insulating film for forming said stacked capacitor, a capacitor gate insulating film formed to cover a surface of said storage node, a plate electrode formed to cover at least said storage node and said capacitor gate insulating film, first connection means for electrically connecting said storage node with said semiconductor substrate, a first part of a third interlayer insulating film formed on said first part of said second interlayer insulating film to cover said plate electrode, and a first metal wire contact hole formed through said first part of said third interlayer insulating film to electrically connect a first metal wire layer formed on said first part of said third interlayer insulating film with said plate electrode through a first metal buried layer in the first metal wire contact hole, said first metal buried layer in the first metal wire contact hole and said plate electrode being directly connected, and said peripheral circuit part comprises, a first conductivity type first semiconductor region and a second conductivity type second semiconductor region selectively formed in said semiconductor substrate, a second part of said first interlayer insulating film formed on said semiconductor substrate, a second part of said second interlayer insulating film formed on said second part of said first interlayer insulating film, a second part of said third interlayer insulating film formed on said second part of said second interlayer insulating film, a second metal wire layer being formed on said second part of said third interlayer insulating film, a second metal wire contact hole formed through at least said second part of said third interlayer insulating film, with a second metal buried layer in the second metal wire contact hole connected to said second metal wire layer, a plug layer for electrically connecting said second metal buried layer in said second metal wire contact hole with said first and second semiconductor regions, said second metal buried layer and said a plug layer being directly connected, and said second metal wire contact hole having a depth substantially identical to that of said first metal wire contact hole.

2. The semiconductor device in accordance with claim 1, wherein said first connection means is provided with, a first storage node contact hole formed through said first parts of said first and second interior insulating films to reach said semiconductor substrate, with a first storage node buried layer of a same material as said storage node formed in said first storage node contact hole, and said a plug layer is provided with, a second bit line contact hole formed through said second part of said first interlayer insulating film, with a second bit line buried layer of a same material as said bit line formed in the second bit line contact hole.

3. The semiconductor device in accordance with claim 2, wherein said second bit line buried layer is a polysilicon layer containing a first conductivity type impurity of relatively high concentration, and said peripheral circuit part comprises a metal silicide film being provided on at least said second semiconductor region.

4. The semiconductor device in accordance with claim 1, wherein said first connection means is provided with, a first storage node contact hole formed through said first parts of said first and second interlayer insulating films to reach said semiconductor substrate, with a first storage node buried layer of a same material as said storage node formed in the first storage node contact hole, and said a plug layer is provided with, a second bit line contact hole formed through said second part of said first interior insulating film in the same step as said first bit line contact hole, with a second bit line buried layer of a same material as said bit line formed in the second bit line contact hole, and a second storage node contact hole formed through said second part of said second interlayer insulating film, with a second storage node buried layer of a same material as said storage node formed in the second storage node contact hole.

5. The semiconductor device in accordance with claim 4, wherein said second bit line buried layer is a polysilicon layer containing a first conductivity type impurity of relatively high concentration, and said peripheral circuit part comprises a metal silicide film being provided on at least said second semiconductor region.

6. The semiconductor device in accordance with claim 1, wherein said first connection means is provided with, a third bit line contact hole formed through said first part of said first interlayer insulating film, with a third bit line buried layer of a same material as said bit line formed in the third bit line contact hole, and a third storage node contact hole formed through said first part of said second interlayer insulating film, with a third storage node buried layer of a same material as said storage node formed in the third storage node contact hole, and said a plug layer is provided with, a second bit line contact hole formed through said second part of said first interlayer insulating film, with a second bit line buried layer of a same material as said bit line formed in the second bit line contact hole, and a fourth storage node contact hole formed through said second part of said second interior insulating film, with a fourth storage node buried layer of a same material as said storage node formed in the fourth storage node contact hole.

7. The semiconductor device in accordance with claim 6, wherein said second bit line buried layer is a polysilicon layer containing a first conductivity type impurity of relatively high concentration, and said peripheral circuit part comprises a metal silicide film being formed on at least said second semiconductor region.

8. The semiconductor device in accordance with claim 1, wherein said first connection means is provided with, a first storage node contact hole formed through said first parts of said first and second interlayer insulating films to reach said semiconductor substrate, with a first storage node buried layer of a same material as said storage node formed in the first storage node contact hole, and said a plug layer is provided with, a fifth storage node contact hole formed through said second parts of said first and second interlayer insulating films, with a fifth storage node buried layer of a same material as said storage node formed in the fifth storage node contact hole.

9. The semiconductor device in accordance with claim 8, wherein said fifth storage node buried layer is a polysilicon layer containing a first conductivity type impurity of relatively high concentration, and said peripheral circuit part comprises a metal silicide film being provided on at least said second semiconductor region.

* * * * *